US012796026B2

(12) United States Patent
Tsai et al.

(10) Patent No.: US 12,796,026 B2
(45) Date of Patent: Nov. 10, 2026

(54) CHANNEL REGIONS IN STACKED TRANSISTORS AND METHODS OF FORMING THE SAME

(71) Applicant: Taiwan Semiconductor Manufacturing Co., Ltd., Hsinchu (TW)

(72) Inventors: Chen-Fong Tsai, Hsinchu (TW); Han-De Chen, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 482 days.

(21) Appl. No.: 18/463,466

(22) Filed: Sep. 8, 2023

(65) Prior Publication Data

US 2025/0089313 A1 Mar. 13, 2025

(51) Int. Cl.
*H10D 62/10* (2025.01)
*H10D 30/01* (2025.01)
(Continued)

(52) U.S. Cl.
CPC ......... *H10D 62/121* (2025.01); *H10D 30/014* (2025.01); *H10D 30/43* (2025.01);
(Continued)

(58) Field of Classification Search
CPC .. H10D 30/014; H10D 30/43; H10D 30/6757; H10D 30/6735; H10D 62/40;
(Continued)

(56) References Cited

U.S. PATENT DOCUMENTS

2023/0037957 A1* 2/2023 Thomas ............... H10D 84/856

FOREIGN PATENT DOCUMENTS

WO 2022269447 A1 12/2022

OTHER PUBLICATIONS

Tong, "Semiconductor Wafer Bonding: Science and Technology," The Electrochemical Society Series, ISBN: 978-0-471-57481-1, Dec. 1998, 3 pages.

(Continued)

*Primary Examiner* — Monica D Harrison
(74) *Attorney, Agent, or Firm* — Slater Matsil, LLP

(57) ABSTRACT

A method includes: epitaxially growing a first multi-layer stack over a first substrate; epitaxially growing a second multi-layer stack over a second substrate; and bonding the first multi-layer stack to the second multi-layer stack. The first substrate and the second substrate have different crystalline orientations. The method further includes patterning the first multi-layer stack and the second multi-layer stack to form a fin, the fin comprising a plurality of lower nanostructures alternatingly stacked with first dummy nanostructures and a plurality of upper nanostructures alternatingly stacked with second dummy nanostructure; replacing the first dummy nanostructures with a first gate stack, the first gate stack surrounding each of the plurality of lower nanostructures; and replacing the second dummy nanostructures with a second gate stack, the second gate stack surrounding each of the plurality of upper nanostructures.

20 Claims, 19 Drawing Sheets

(51) Int. Cl.

| | |
|---|---|
| ***H10D 30/43*** | (2025.01) |
| ***H10D 30/67*** | (2025.01) |
| ***H10D 62/13*** | (2025.01) |
| ***H10D 62/40*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |
| ***H10P 14/20*** | (2026.01) |

(52) U.S. Cl.
CPC ..... *H10D 30/6735* (2025.01); *H10D 30/6757* (2025.01); *H10D 62/151* (2025.01); *H10D 62/40* (2025.01); *H10D 64/017* (2025.01); *H10D 84/0167* (2025.01); *H10D 84/017* (2025.01); *H10D 84/038* (2025.01); *H10D 84/85* (2025.01); *H10P 14/2926* (2026.01)

(58) Field of Classification Search
CPC .. H10D 62/121; H10D 62/151; H10D 64/017; H10D 84/038; H10D 84/0167; H10D 84/017; H10D 84/85; H10D 30/797; H10D 62/822; H10D 30/019; H10D 30/501; H10D 84/0177; H10D 84/0188; H10D 88/01; H10D 30/62; H10D 30/024; H10P 14/2926; H10P 90/1914; B82Y 10/00
USPC .......................................................... 257/288
See application file for complete search history.

(56) References Cited

OTHER PUBLICATIONS

Berthold et al., “Wafer-to-wafer fusion bonding of oxidized silicon to silicon at low temperatures,” Sensors and Actuators A, vol. 68, Jun. 15, 1998, pp. 410-413.

* cited by examiner

CHANNEL REGIONS IN STACKED TRANSISTORS AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
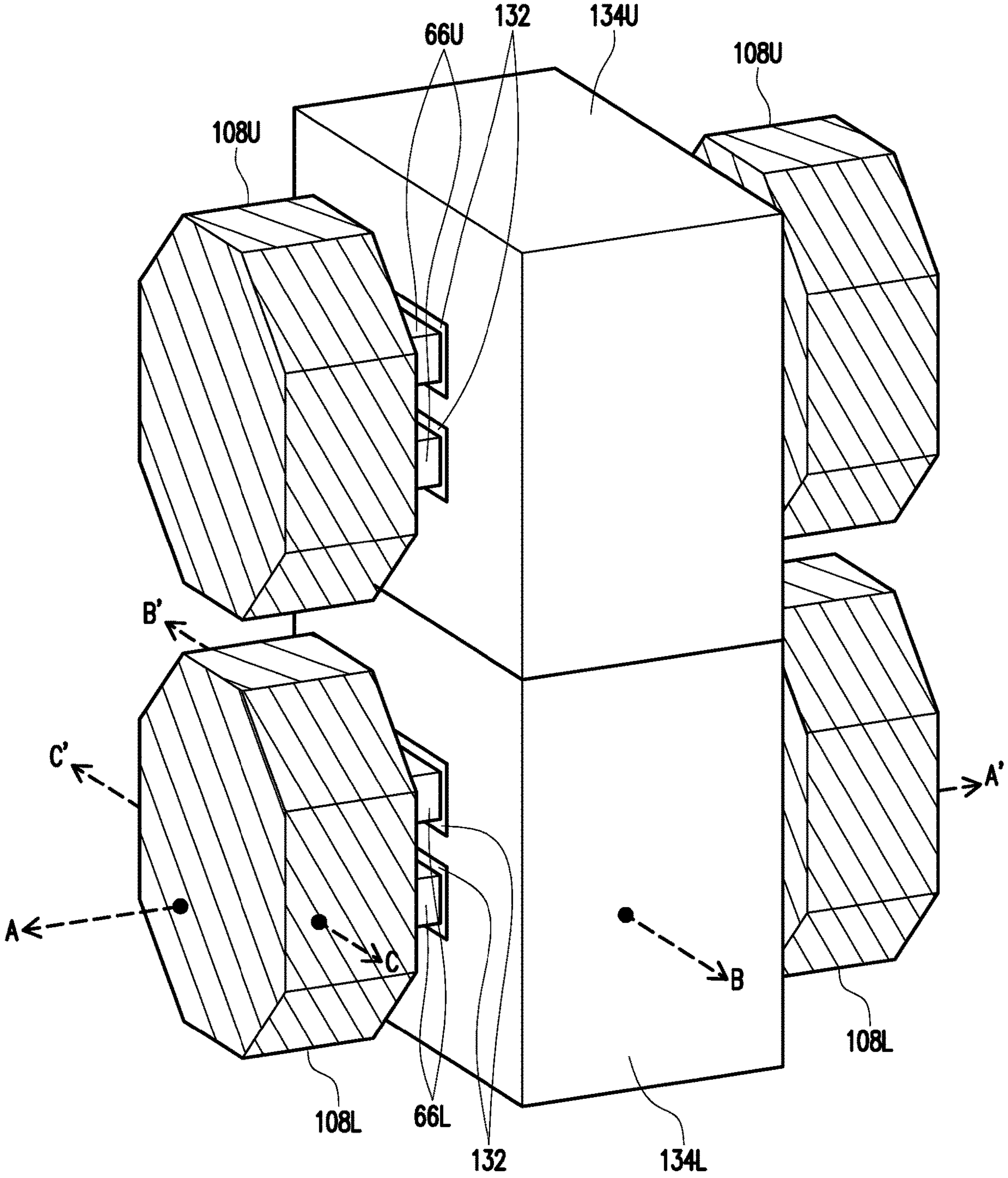
FIG. 1 illustrates an example schematic of a stacked transistor, such as a complementary field-effect transistor (CFET), in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, stacking transistors, such as CFETs, are formed. A CFET includes a n-type nanostructure-FET and a p-type nanostructure-FET that are vertically stacked together. NFET channel regions of the n-type nanostructure-FET and pFET channel regions of the p-type nanostructure-FET may be epitaxially grown on two different substrates each oriented in a different crystalline plane. For example, the NFET channel regions may be formed of first semiconductor layers that are epitaxially grown on a (100) plane-oriented silicon substrate, and the PFET channel regions may be formed of second semiconductor layers that are epitaxially grown on a (110) plane-oriented silicon substrate. Subsequently, the two substrates are bonded together, and CFETs are formed from the bonded structure. In this manner, p-type nanostructure FETs can be formed on (110) plane-oriented silicon for increased mobility without degrading the performance of the n-type nanostructure FETs. As such, various embodiments allow for a CFET with improved p-type nanostructure FET performance without compromising the n-type nanostructure FET performance.

FIG. 1 illustrates an example of a CFET schematic, in accordance with some embodiments. FIG. 1 is a three-dimensional view, where some features of the CFETs are omitted for illustration clarity.

The CFETs include multiple vertically stacked nanostructure-FETs (e.g., nanowire FETs, nanosheet FETs, multi bridge channel (MBC) FETs, nanoribbon FETs, gate-all-around (GAA) FETs, or the like). For example, a CFET may include a lower nanostructure-FET of a first device type (e.g., n-type/p-type) and an upper nanostructure-FET of a second device type (e.g., p-type/n-type) that is opposite the first device type. Specifically, the CFET may include a lower PMOS transistor and an upper NMOS transistor, or the CFET may include a lower NMOS transistor and an upper PMOS transistor. For simplicity, various embodiments may be described below in the context of manufacturing a CFET with a lower PMOS transistor and an upper NMOS transistor. However, it should be appreciated that various embodiments may also be applied to CFETs having a lower NMOS transistor and an upper PMOS transistor.

Each of the nanostructure-FETs include semiconductor nanostructures 66 (labeled lower semiconductor nanostructures 66L and upper semiconductor nanostructures 66U), where the semiconductor nanostructures 66 act as channel regions for the nanostructure-FETs. The semiconductor nanostructures 66 may be nanosheets, nanowires, or the like. The lower semiconductor nanostructures 66L are for a lower nanostructure-FET and the upper semiconductor nanostructures 66U are for an upper nanostructure-FET. A channel isolation material (not explicitly illustrated in FIG. 1, see FIG. 12A) may be used to separate and electrically isolate the upper semiconductor nanostructures 66U from the lower semiconductor nanostructures 66L.

Gate dielectrics 132 are along top surfaces, sidewalls, and bottom surfaces of the semiconductor nanostructures 66. Gate electrodes 134 (including a lower gate electrode 134L and an upper gate electrode 134U) are over the gate dielectrics 132 and around the semiconductor nanostructures 66. Source/drain regions 108 (labeled lower source/drain regions 108L and upper source/drain regions 108U) are disposed at opposing sides of the gate dielectrics 132 and the gate electrodes 134. Source/drain region(s) 108 may refer to a source or a drain, individually or collectively dependent upon the context. Isolation features may be formed to separate desired ones of the source/drain regions 108 and/or desired ones of the gate electrodes 134. For example, a lower gate electrode 134L may optionally be separated from an upper gate electrode 134U. Alternatively, the lower gate electrode 134L may be coupled to the upper gate electrode 134U. Further, the upper source/drain regions 108U may be separated from lower source/drain regions 108L by one or more dielectric layers (not explicitly illustrated in FIG. 1, see FIGS. 20A-20C). The isolation features between channel regions, gates, and source/drain regions allow for vertically stacked transistors, thereby improving device density. Because of the vertically stacked nature of CFETs, the schematic may also be referred to as stacking transistors or folding transistors.

FIG. 1 further illustrates reference cross-sections that are used in later figures. Cross-section A-A' is parallel to a longitudinal axis of the semiconductor nanostructures 66 of a CFET and in a direction of, for example, a current flow between the source/drain regions 108 of the CFET. Cross-section B-B' is perpendicular to cross-section A-A' and along a longitudinal axis of a gate electrode 134 of a CFET. Cross-section C-C' is parallel to cross-section B-B' and extends through the source/drain regions 108 of the CFETs. Subsequent figures refer to these reference cross-sections for clarity.

FIGS. 2-13 are views of intermediate stages in the manufacturing of CFETs, in accordance with some embodiments. FIGS. 2A, 2B, 3A, 3B, 4A, 5, 6, 7, and 8 are three-dimensional views showing a similar three-dimensional view as FIG. 1. FIGS. 9, 10, 11, 12A, 13A, and 14 illustrate cross-sectional views along a similar cross-section as reference cross-section A-A' in FIG. 1. FIGS. 12B and 13B illustrate cross-sectional views along a similar cross-section as reference cross-section B-B' in FIG. 1. FIGS. 12C and 13C illustrate cross-sectional views along a similar cross-section as reference cross-section C-C' in FIG. 1.

Figure 2A:
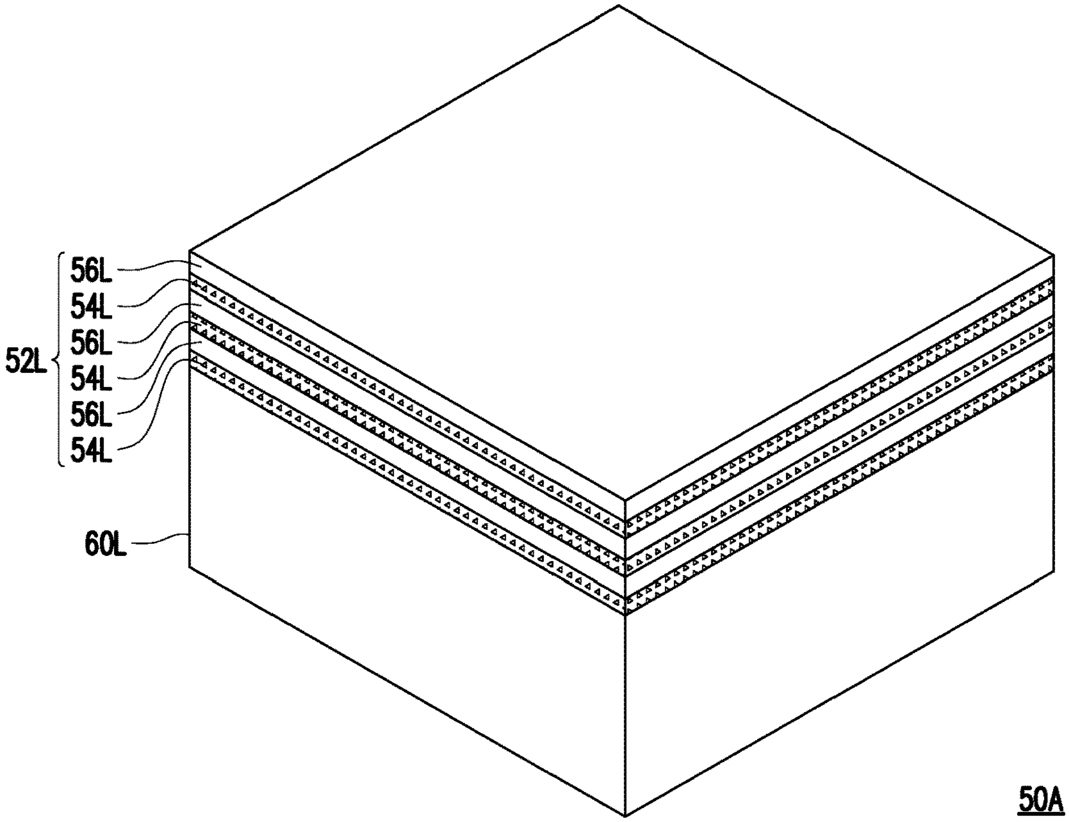
FIGS. 2A, 2B, 3A, 3B, 4A, 4B, 4C, 4D, 5, 6, 7, 8, 9, 10, 11, 12A, 12B, 12C, 13A, 13B, 13C, and 14 illustrate varying views of intermediate stages in the manufacturing of CFETs, in accordance with some embodiments.
Figure 2B:
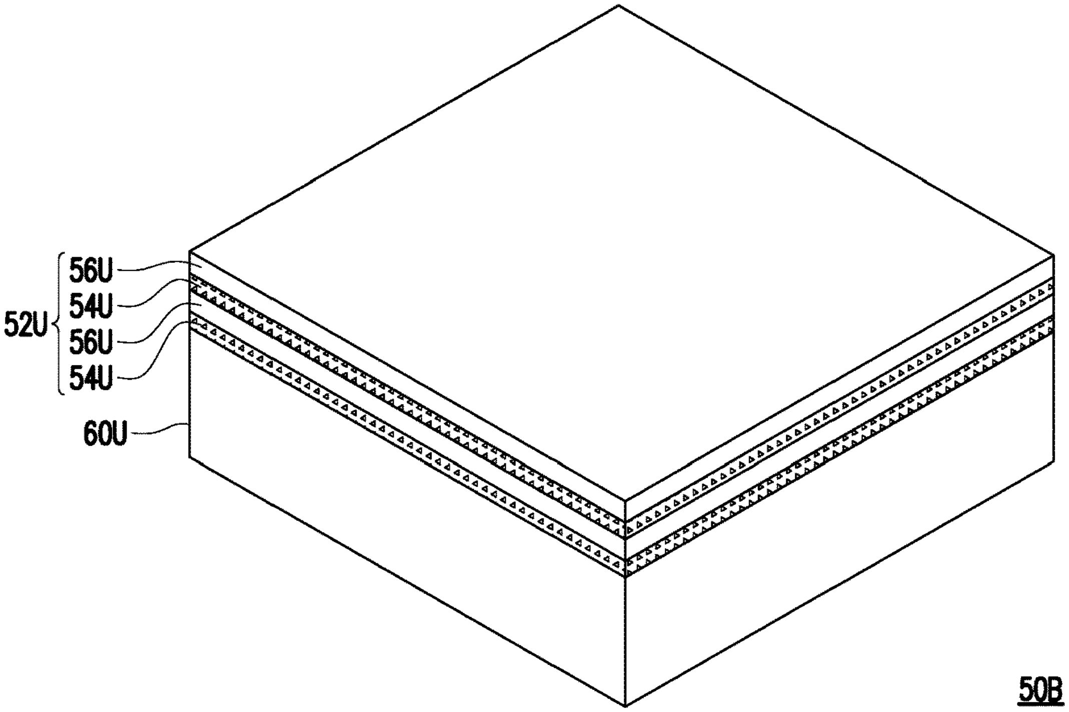

In FIGS. 2A and 2B, two substrates 60L and 60U are separately provided. FIG. 2A illustrates a substrate 60L, and FIG. 2B illustrates a substrate 60U. In subsequently processes, the substrate 60U may be bonded over the substrate 60L (see FIG. 4). As such, the substrate 60L may be referred to as a lower substrate 60L, and the substrate 60U may also be referred to as an upper substrate 60U. Each of the substrates 60L and 60U may be a semiconductor substrate, such as a bulk semiconductor, a semiconductor-on-insulator (SOI) substrate, or the like, which may be doped (e.g., with a p-type or an n-type dopant) or undoped. The substrates 60L and 60U may each be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrates 60L and 60U may include silicon; germanium; a compound semiconductor including carbon-doped silicon, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In various embodiments, the substrate 60L has a different crystalline orientation than the substrate 60U. The crystalline orientation of the substrates 60U and 60L may depend on a type of channel region that will be made from semiconductor layers grown on each of the substrates 60L and 60U. For example, the substrate 60L is an (110) oriented substrate while the substrate 60U is an (100) oriented substrate. As another example, the substrate 60L is an (100) oriented substrate, and the substrate 60U is a (110) oriented substrate. Forming channel regions for p-type transistor devices from semiconductor layers grown on an (110) plane-oriented semiconductor surface has advantages including increased mobility, thereby resulting in improved p-type transistor device performance. However, forming channel regions for n-type devices from semiconductor layers grown on (110) plane-oriented semiconductor surface may degrade n-type transistor device performance. By growing channel materials on two substrates having different crystalline orientations, p-type device performance can be improved without degrading n-type device performance.

A multi-layer stack 52L and a multi-layer stack 52U are formed over the substrate 60L and the substrate 60U, respectively. The multi-layer stack 52L includes alternating dummy semiconductor layers 54L and semiconductor layers 56L, and the multi-layer stack 52U includes alternating dummy semiconductor layers 54U and semiconductor layers 56U. After the substrates 60U and 60L are subsequently bonded together, the dummy semiconductor layers 54L and the semiconductor layers 56L are disposed below the dummy semiconductor layers 54L and the semiconductor layers 56U (see FIG. 4). As such, the layers 54L and 56L may also be referred to as lower dummy semiconductor layers 54L and lower semiconductor layers 56L, respectively, and the layers 54U and 56U may be also be referred to as upper dummy semiconductor layers 54U and upper semiconductor layers 56U, respectively. As subsequently described in greater detail, the dummy semiconductor layers 54L and 54U will be removed and the semiconductor layers 56L and 45U will be patterned to form channel regions of CFETs. Specifically, the lower semiconductor layers 56L will be patterned to form channel regions of the lower nanostructure-FETs of the CFETs, and the upper semiconductor layers 56U will be patterned to form channel regions of the upper nanostructure-FETs of the CFETs.

The multi-layer stacks 52L and 52U are each illustrated as including a specific number of the dummy semiconductor layers 54L/54U and the semiconductor layers 56L/56U. It should be appreciated that the multi-layer stacks 52L and 52U may include any number of the dummy semiconductor layers 54L/54U and/or the semiconductor layers 56L/56U. Each layer of the multi-layer stacks 52L and 52U may be grown by a process such as vapor phase epitaxy (VPE) or molecular beam epitaxy (MBE), deposited by a process such as chemical vapor deposition (CVD) or atomic layer deposition (ALD), or the like.

In embodiments where the lower nanostructure-FETs of the CFETs are p-type nanostructure FETs and the upper nanostructure-FETs of the CFETs are n-type nanostructure FETs, the multi-layer stack 52L is grown on a (110) plane-oriented surface of the lower substrate 60L, and the multi-layer stack 52U is grown on a (100) plane-oriented surface of the upper substrate 60U. In such embodiments, the lower substrate 60L may be a (110) plane-oriented silicon substrate, and the upper substrate 60U may be a (100) plane-oriented silicon substrate. In embodiments where the lower nanostructure-FETs of the CFETs are n-type nanostructure FETs and the upper nanostructure-FETs of the CFETs are p-type nanostructure FETs, the multi-layer stack 52L is grown on a (100) plane-oriented surface of the lower substrate 60L, and the multi-layer stack 52U is grown on a (110) plane-oriented surface of the upper substrate 60U. In such embodiments, the lower substrate 60L may be a (100) plane-oriented silicon substrate, and the upper substrate 60U may be a (110) plane-oriented silicon substrate. In this manner, various embodiments provide p-type transistors with improved performance (e.g., improved mobility) without degrading the performance of the n-type transistors because the p-type and n-type transistors have channel material that are separately grown on different crystalline orientation substrates.

The semiconductor layers of the lower multi-layer stack 52L may match a crystalline orientation of the lower substrate 60L, and the semiconductor layers of the upper multi-layer stack 52U may match a crystalline orientation of the upper substrate 60U. Superficially, the lower multi-layer stack 52L may have a different crystalline orientation than the upper multi-layer stack 52U due to the different crystalline orientations of the substrates 60L and 60U. For example, when the multi-layer stack 52L is grown on a (110) plane-oriented surface of the lower substrate 60L, the dummy semiconductor layers 54L and the semiconductor layers 56L may likewise include a crystalline structure oriented along the (110) plane. Further, when the multi-layer stack 52U is grown on a (100) plane-oriented surface of the upper substrate 60U, the dummy semiconductor layers 54U and the semiconductor layers 56U may likewise include a crystalline structure oriented along the (100) plane. Conversely, when the multi-layer stack 52L is grown on a (100) plane-oriented surface of the lower substrate 60L, the dummy semiconductor layers 54L and the semiconductor layers 56L may likewise include a crystalline structure oriented along the (100) plane. Further, when the multi-layer stack 52U is grown on a (110) plane-oriented surface of the upper substrate 60U, the dummy semiconductor layers 54U and the semiconductor layers 56U may likewise include a crystalline structure oriented along the (110) plane. As such, when the substrates 60U and 60L are subsequently bonded together, the bonded structure includes hetero-orientation semiconductor layers.

The dummy semiconductor layers 54U and 54L are formed of a first semiconductor material selected from the candidate semiconductor materials of the substrates 60U and 60L. The semiconductor layers 56U and 56L are formed of one or more second semiconductor material(s). The second semiconductor material(s) may be selected from the candidate semiconductor materials of the substrates 60U and 60L. The lower semiconductor layers 56L and the upper semiconductor layers 56U may be formed of the same semiconductor material, or may be formed of different semiconductor materials. In some embodiments, the lower semiconductor layers 56L and the upper semiconductor layers 56U are both be formed of a semiconductor material suitable for p-type devices and n-type devices, such as silicon. In some embodiments, the lower semiconductor layers 56L are formed of a semiconductor material suitable for p-type devices, such as germanium or silicon germanium, and the upper semiconductor layers 56U are formed of a semiconductor material suitable for n-type devices, such as silicon or carbon-doped silicon.

The semiconductor material(s) of the semiconductor layers 56U and 56L are different from and have a high etching selectivity to the semiconductor materials of the dummy semiconductor layers 54U and 54L. As such, the materials of the dummy semiconductor layers 54U and 54L may be removed at a faster rate than the material of the semiconductor layers 56U and 56L in subsequent processing. In some embodiments, the dummy semiconductor layers 54U and 54L are formed of silicon germanium, and the semiconductor layers 56U and 56L are formed of silicon. The silicon of the semiconductor layers 56U and 56L may be undoped or lightly doped at this step of processing.

Figure 3A:
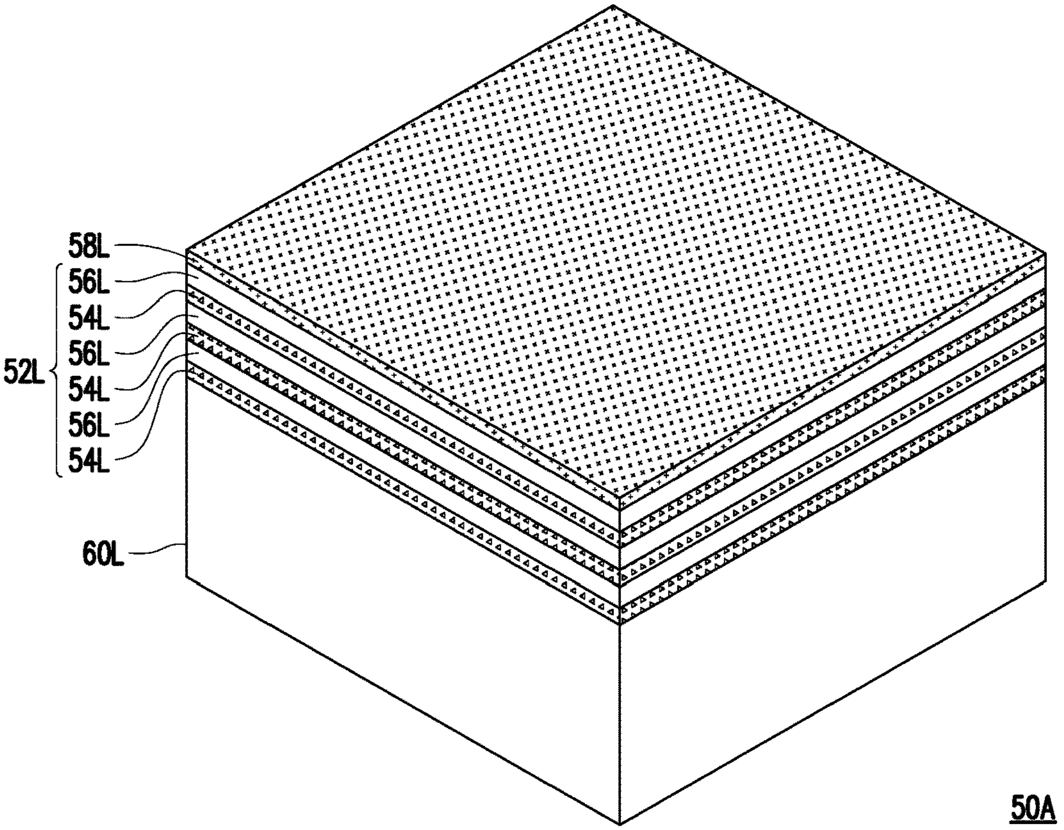
Figure 3B:
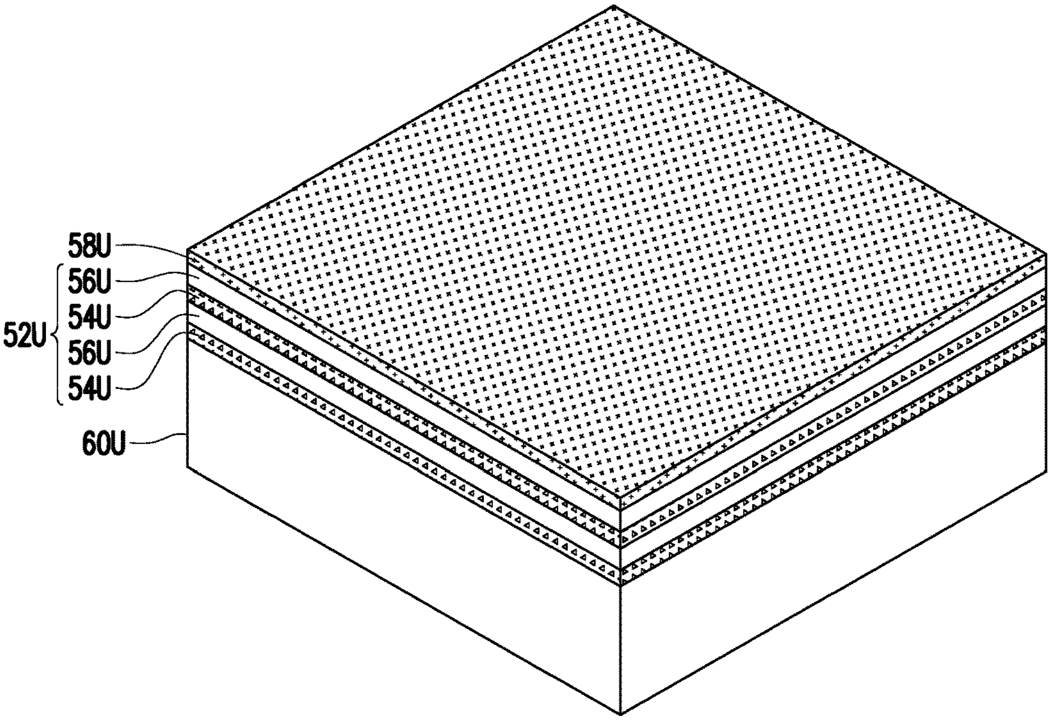

In FIGS. 3A and 3B, insulating bonding layers 58L and 58U are deposited on the multi-layer stacks 52L and 52U, respectively. FIG. 3A illustrates a perspective view of the substrate 60L, the multi-layer stack 52L (including the dummy semiconductor layers 54L and the semiconductor layers 56L), and the bonding layer 58L; and FIG. 3B illustrates a perspective view of the substrate 60U, the multi-layer stack 52U (including the dummy semiconductor layers 54U and the semiconductor layers 56U), and the bonding layer 58U. The bonding layers 58L and 58U may be deposited by any suitable process, such as physical vapor deposition (PVD), CVD, ALD, or the like. The bonding layers 58L and 58U may facilitate the bonding of the lower substrate 60L to the upper substrate 60U in subsequent processes (see FIG. 4). The bonding layers 58L and 58U may each comprise an insulating material that is suitable for a subsequent dielectric-to-dielectric bonding process. Example materials for the bonding layers 58L and 58U include silicon oxide (e.g., SiO2), silicon nitride, silicon oxynitride, silicon carbonitride, silicon oxycarbonitride, or the like. A material composition of the bonding layer 58L may be the same or different than a material composition of the bonding layer 58U.

Figure 4A:
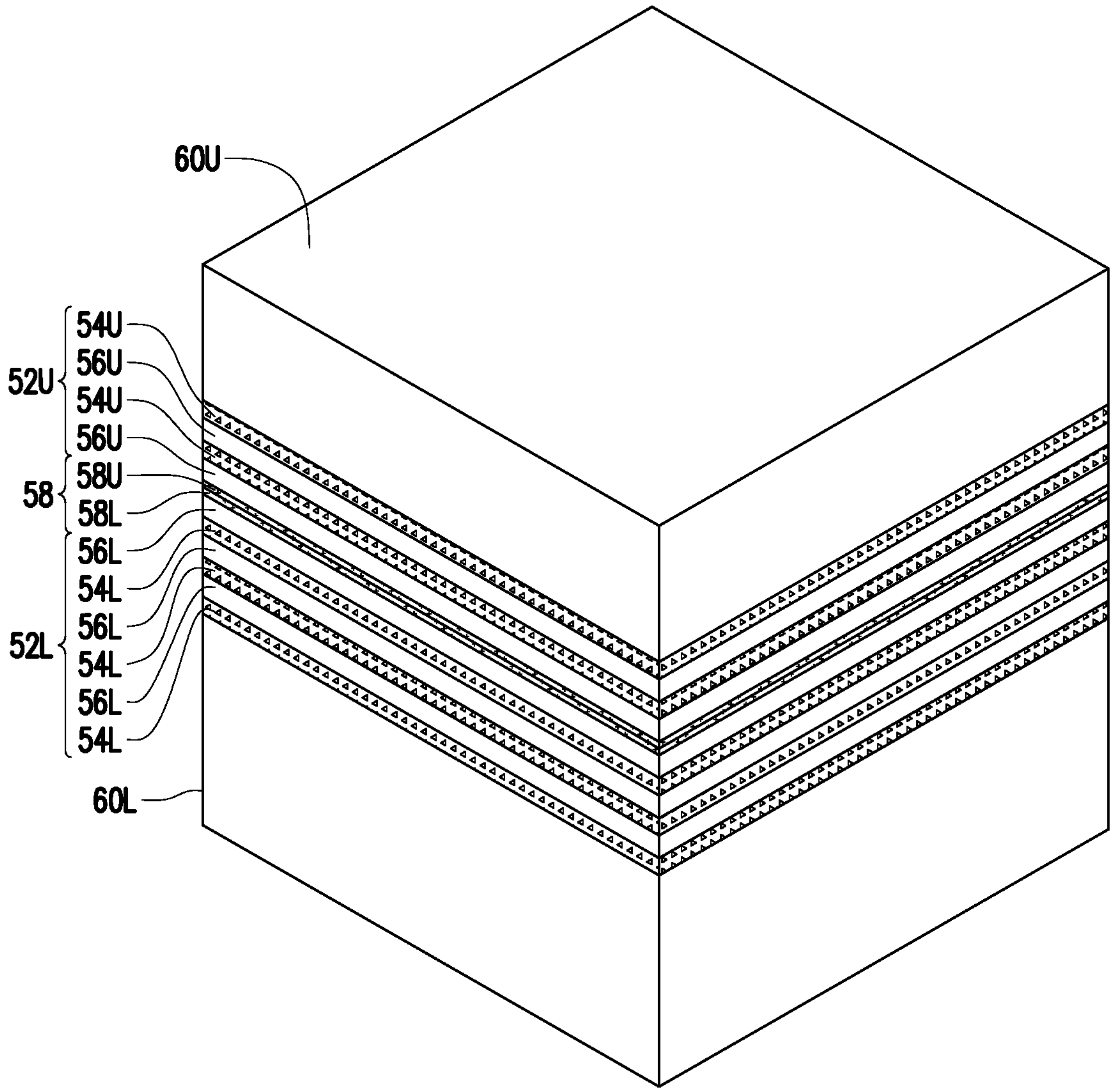
Figure 4B:
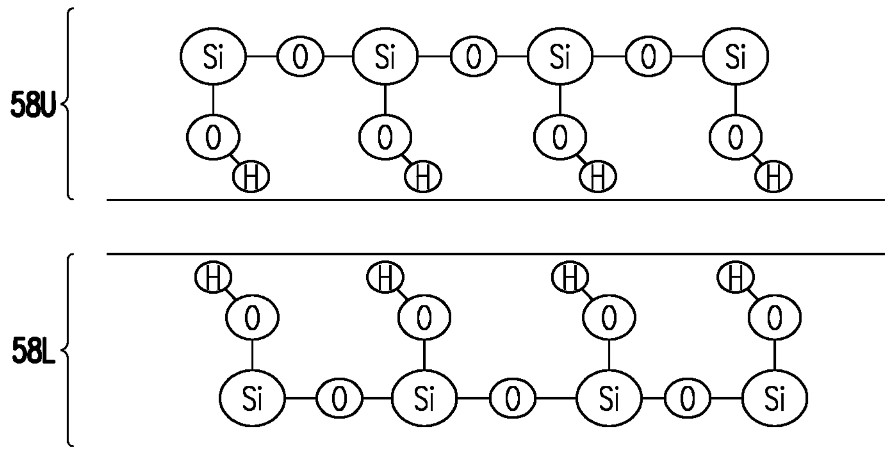
Figure 4C:
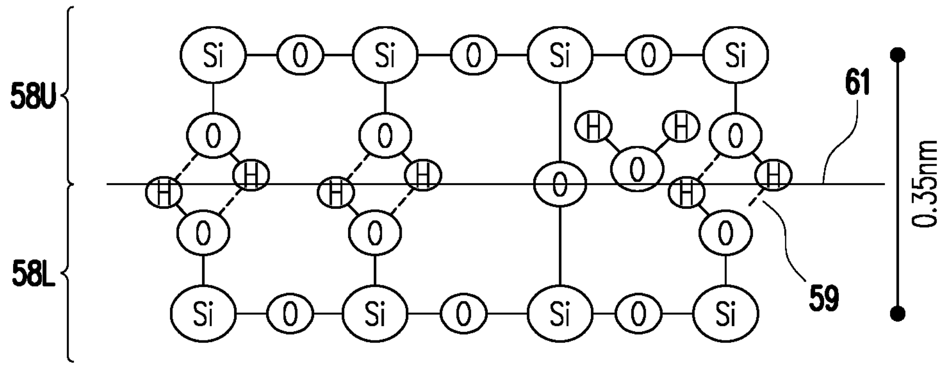
Figure 4D:
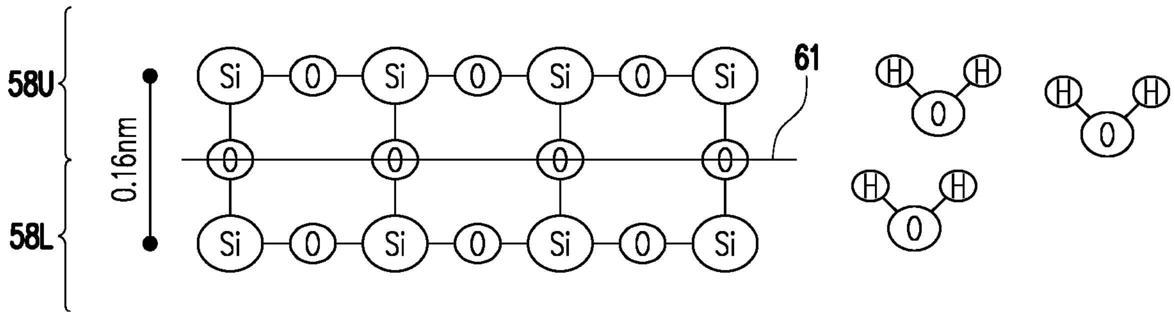

In FIGS. 4A through 4D, the upper substrate 60U, having the multi-layer stack 52U disposed thereon, is placed over and bonded to the lower substrate 60L, having the multi-layer stack 52L disposed thereon. As illustrated by FIG. 4A, the bonded structure includes the lower substrate 60L; the lower multi-layer stack 52L over the lower substrate 60L; the bonding layers 58L and 58U over the lower multi-layer stack 52L; the upper multi-layer stack 52U over the bonding layers 58L and 58U; and the upper substrate 60U over the upper multi-layer stack 52U. The upper substrate 60U may be bonded to the lower substrate 60L by the bonding layers 58L and 58U. Specifically, the bonding layers 58L and 58U may be bonded together using a suitable technique, such as dielectric-to-dielectric bonding, or the like. After bonding, the lower bonding layer 58L and the upper bonding layer 58U may be collectively referred to as a bonded layer 58. The bonded layer 58 may or may not have an interface disposed therein where the bonding layer 58L meets the bonding layer 58U. FIGS. 4B through 4D illustrates schematics of a bonding mechanism for the bonding layers 58L and 58U when the bonding layers 58L and 58U are silicon oxide layers. Other bonding mechanisms are possible in other embodiments.

In FIG. 4B, the dielectric-to-dielectric bonding process include applying a surface treatment to one or more of the bonding layers 58L or 58U to form hydroxyl (OH) groups at bonding surfaces of the bonding layers 58L and 58U. The surface treatment may include a plasma treatment. For example, the plasma treatment may apply nitrogen ($N_2$) plasma to exposed surfaces of the bonding layers 58L and 58U at a pressure in a range of 0.2 mbar to 0.4 mbar; with high frequency (e.g., in a range of 377 Hz to 417 Hz) power in a range of 10 W to 20 W; with low frequency (e.g., in a range of 35 Hz to 45 Hz) power in a range of 45 W to 55 W; for a duration in a range of 12 s to 22 s; and at room temperature (e.g., in a range of 25° C. to 26° C.). Other plasma treatment parameters are also possible. After the plasma treatment, the surface treatment may further include a cleaning process that may be applied to one or more of the bonding layers 58L and 58U. The cleaning process may include rinsing with a nitrogen ($N_2$) and water ($H_2O$) mixture at a speed of 450 rpm to 550 rpm for a duration of 25 s to 35 s at room temperature. The rinsing mixture may supply nitrogen at a rate of 60 slm to 80 slm and water at a rate of 0.6 slm to 0.8 slm. After rinsing, a spin dry may be performed at a rate of 1900 rpm to 2100 rpm for a duration of 9 s to 13 s at room temperature. As a result, surfaces of the bonding layers 58L and 58U may be terminated with the hydroxyl groups. Other cleaning processes may be applied in other embodiments.

In FIG. 4C, the bonding layer 58U may be placed over and aligned to the bonding layer 58L. The two bonding layers 58L and 58U are then pressed against each other to initiate a pre-bonding of the upper substrate 60U to the lower substrate 60L. The pre-bonding be performed at room temperature (e.g., in a range of 25° C. to 26° C.). The pre-bonding may trigger the formation of hydrogen bridges 59 at an interface 61 where the lower bonding layer 58L touches the upper bonding layer 58U. Specifically, pairs of bridged Si—OH groups from the bonding layers 58L and 58U may define siloxane and water at the interface 61.

After the pre-bonding, in FIG. 4D, an annealing process may be applied by, for example, heating the substrates 60L and 60U to a temperature of in a range of 240° C. to 360° C. The annealing process may be performed in a nitrogen ambient for a duration of 1.8 h to 4.2 h and at a pressure of 0.99 atm to 1.01 atm, for example. Other annealing parameters may also be possible. The annealing process drives triggers the formation of covalent bonds between the bonding layers 58L and 58U. Specifically, the annealing process may diffuse away water ($H_2O$) as a byproduct and increase siloxane formation at the interface 61.

A relatively low temperature annealing process may be used in various embodiments because a nitric acid treatment (e.g., the above described cleaning process) may be applied to the bonding layers 58L and 58U, which reduces the undesired formation of water tetramers. The presence of water tetramers may force a high anneal temperature (e.g., greater than 590° C. or ever greater than 610° C.) to break up the tetramers. By applying a fuming nitric acid treatment to the bonding layers 58L and 58U prior to annealing, such water tetramers can be reduced, thereby allowing for a relatively lower temperature anneal to be performed for the bonding process.

Figure 5:
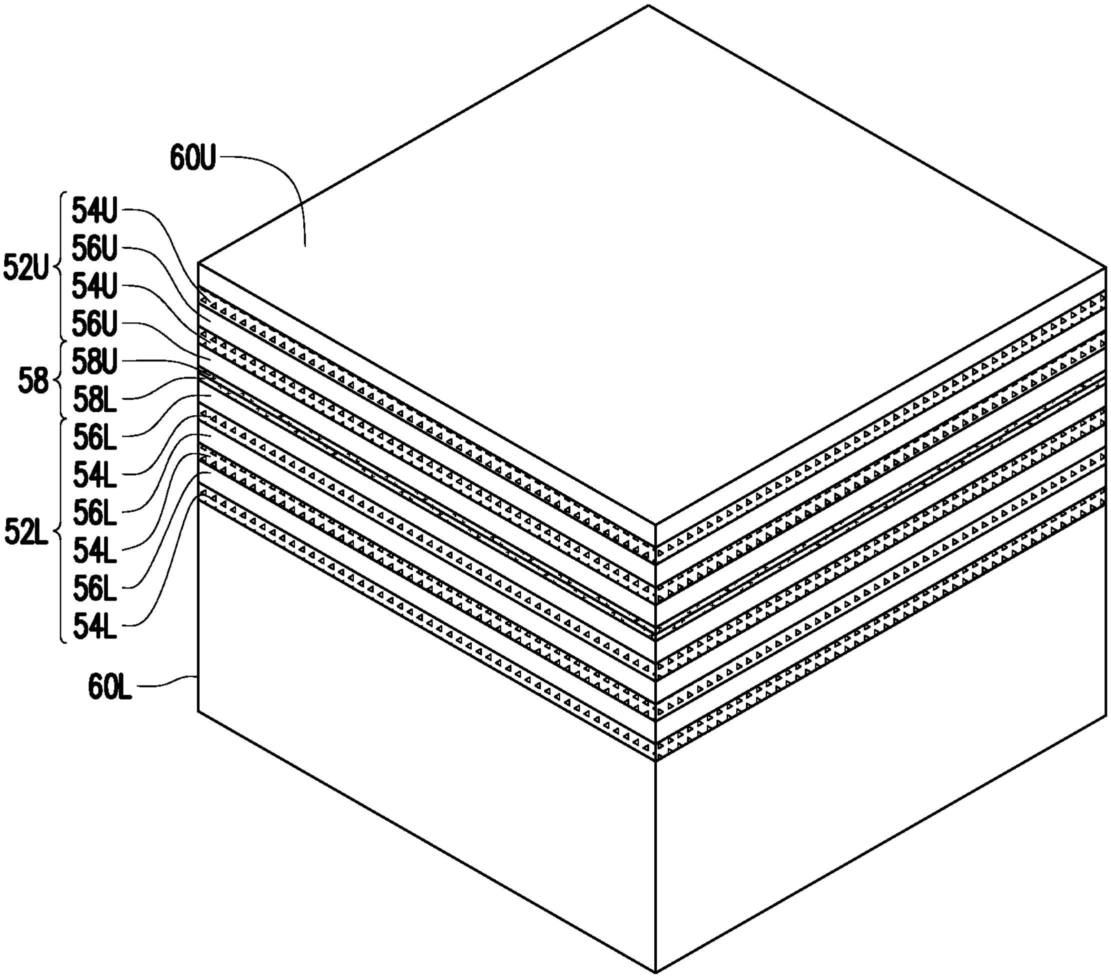

In FIG. 5, a thinning process is applied to reduce a thickness of the upper substrate 60U to a desired thickness. The thinning process may include a grinding process, a chemical mechanical polish (CMP), an etch back process, combination thereof, or the like. The thinning process may reduce a thickness of the upper substrate 60U to match a thickness of each of the semiconductor layers 56U and/or 56L. In subsequent process steps, the thinned, upper substrate 60U may be patterned to provide a nanostructure (e.g., channel region) for an upper nanostructure-FETs of the CFETs.

Figure 6:
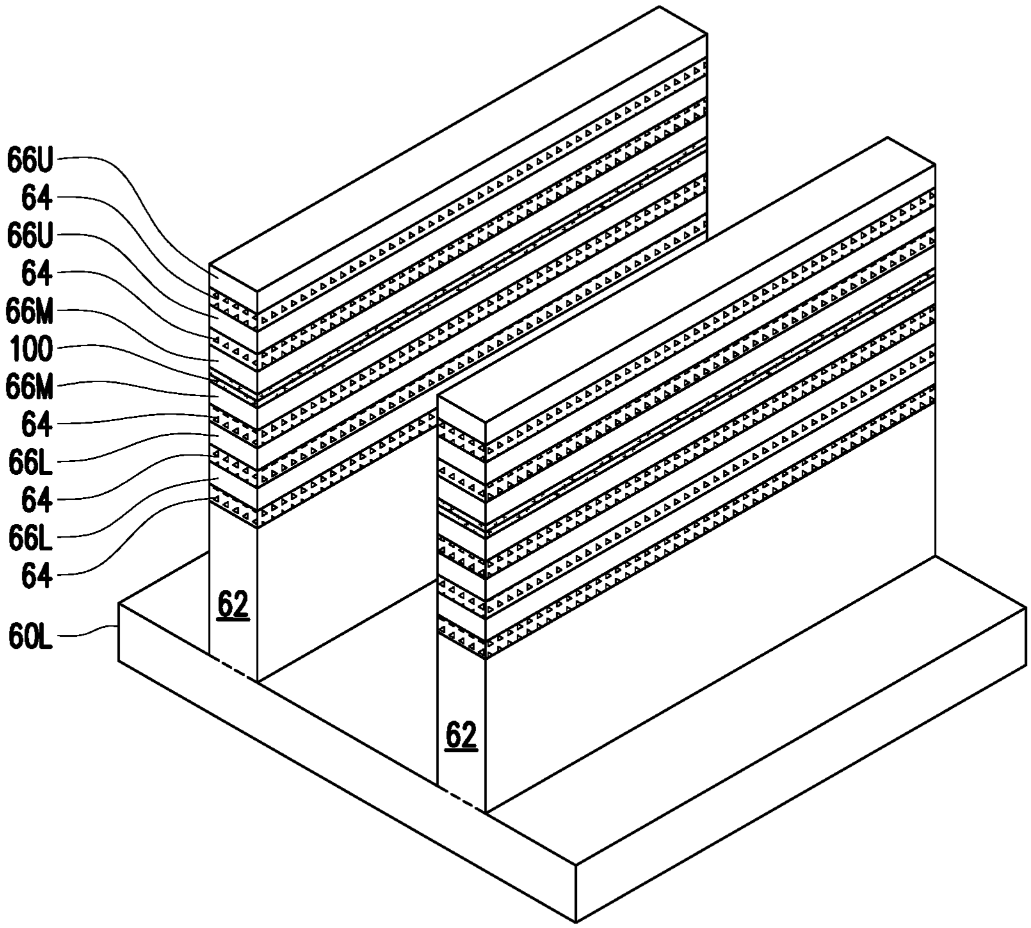

In FIG. 6, semiconductor fins 62 are formed in the lower substrate 60L. Further, nanostructures 64, 66 (including dummy nanostructures 64, lower semiconductor nanostructures 66L, middle semiconductor nanostructures 66M, and upper semiconductor nanostructures 66U) are formed in the upper substrate 60U and the multi-layer stacks 52L and 52U, and an isolation material 100 is formed from the bonded layer 58. In some embodiments, the nanostructures 64, 66, the isolation material 100, and the semiconductor fins 62 by etching trenches in the upper substrate 60U, the upper multi-layer stack 52U, the bonded layer 58, the lower multi-layer stack 52L, and the lower substrate 60L. The etching may be any acceptable etch process, such as a reactive ion etch (RIE), neutral beam etch (NBE), the like, or a combination thereof. The etching may be anisotropic. Forming the nanostructures 64, 66 may define the dummy nanostructure 64 from the lower dummy semiconductor layers 54L and the upper dummy semiconductor layers 54U, the lower semiconductor nanostructures 66L from some of the lower semiconductor layers 56L, the upper semiconductor nanostructures 66U from some of the upper semiconductor layers 56U, and the middle semiconductor nanostructures 66M from some of the lower semiconductor layers 56L and some of the upper semiconductor layers 56U. Due to differences in crystalline orientation of the upper semiconductor layers 56U compared to the lower semiconductor layers 56L, the upper semiconductor nanostructures 66U may also have a different crystalline orientation than the lower semiconductor nanostructures 66L. For example, the upper semiconductor nanostructures 66U may include lateral surfaces oriented in the (100) crystalline plane while the lower semiconductor nanostructures 66L may include lateral surfaces oriented in the (110) crystalline plane. As another example, the upper semiconductor nanostructures 66U may include lateral surfaces oriented in the (110) crystalline plane while the lower semiconductor nanostructures 66L may include lateral surfaces oriented in the (100) crystalline plane. The lower semiconductor nanostructures 66L and the upper semiconductor nanostructures 66U may further be collectively referred to as the semiconductor nanostructures 66.

The lower semiconductor nanostructures 66L will act as channel regions for lower nanostructure-FETs of the CFETs. The upper semiconductor nanostructures 66U will act as channel regions for upper nanostructure-FETs of the CFETs. The middle semiconductor nanostructures 66M are the semiconductor nanostructures 66 that are directly above/below (e.g., in contact with) the second dummy nanostructures 64B. Depending on the heights of subsequently formed source/drain regions, the middle semiconductor nanostructures 66M may or may not adjoin any source/drain regions and may or may not act as functional channel regions for the CFETs. The isolation structures and the middle semiconductor nanostructures 66M may define boundaries of the lower nanostructure-FETs and the upper nanostructure-FETs.

The semiconductor fins 62, the nanostructures 64, 66, and the isolation material 100 may be patterned by any suitable method. For example, the semiconductor fins 62, the nanostructures 64, 66, and the isolation material 100 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the semiconductor fins 62, the nanostructures 64, 66, and the isolation material 100. In some embodiments, a mask (or other layer) may remain on the nanostructures 64, 66.

Although each of the semiconductor fins 62, the nanostructures 64, 66, and the isolation material 100 are illustrated as having a constant width throughout, in other embodiments, the semiconductor fins 62, the nanostructures 64, 66, and/or the isolation material 100 may have tapered sidewalls such that a width of each of the semiconductor fins 62, the nanostructures 64, 66, and/or the isolation material 100 continuously increases in a direction towards the substrate 60L. In such embodiments, each of the nanostructures 64, 66 and the isolation material 100 may have a different width and be trapezoidal in shape.

Figure 7:
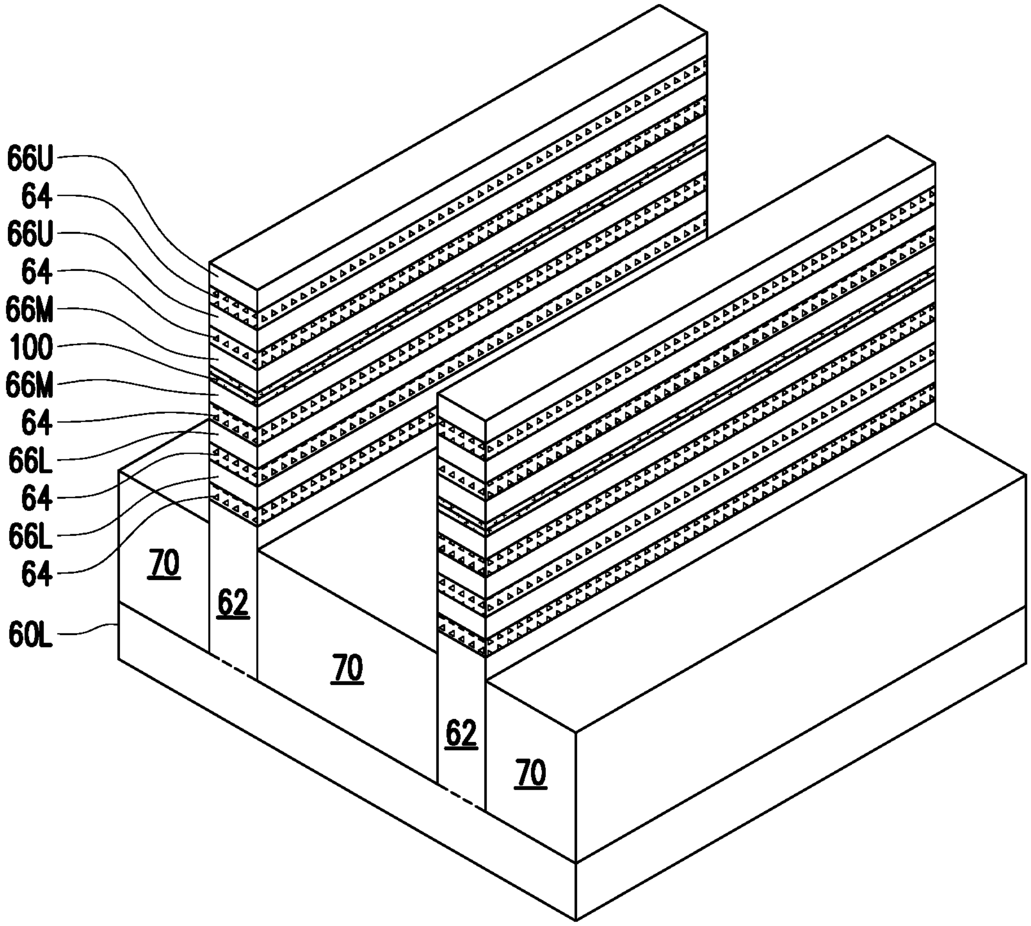

In FIG. 7, isolation regions 70 are formed over the lower substrate 60L and between adjacent semiconductor fins 62. The isolation regions 70 may include a dielectric liner and a dielectric material over the dielectric liner. Each of the dielectric liner and the dielectric material may include an oxide such as silicon oxide, a nitride, such as silicon nitride, the like, or a combination thereof. The formation of the isolation regions 70 may include depositing the dielectric layer(s), and performing a planarization process such as a Chemical Mechanical Polish (CMP) process, a mechanical polishing process, or the like to remove excess portions of the dielectric materials, such as portions over the nanostructures 64, 66. The deposition processes may include ALD, High-Density Plasma CVD (HDP-CVD), Flowable CVD (FCVD), the like, or a combination thereof. In some embodiments, the isolation regions 70 include silicon oxide formed by an FCVD process, followed by an anneal process. Then, the dielectric layers(s) are recessed to define the isolation regions 70. The dielectric layer(s) may be recessed such that upper portions of semiconductor fins 62, the nanostructures 64, 66, and the isolation material 100 extend higher than the remaining STI regions 32.

Figure 8:
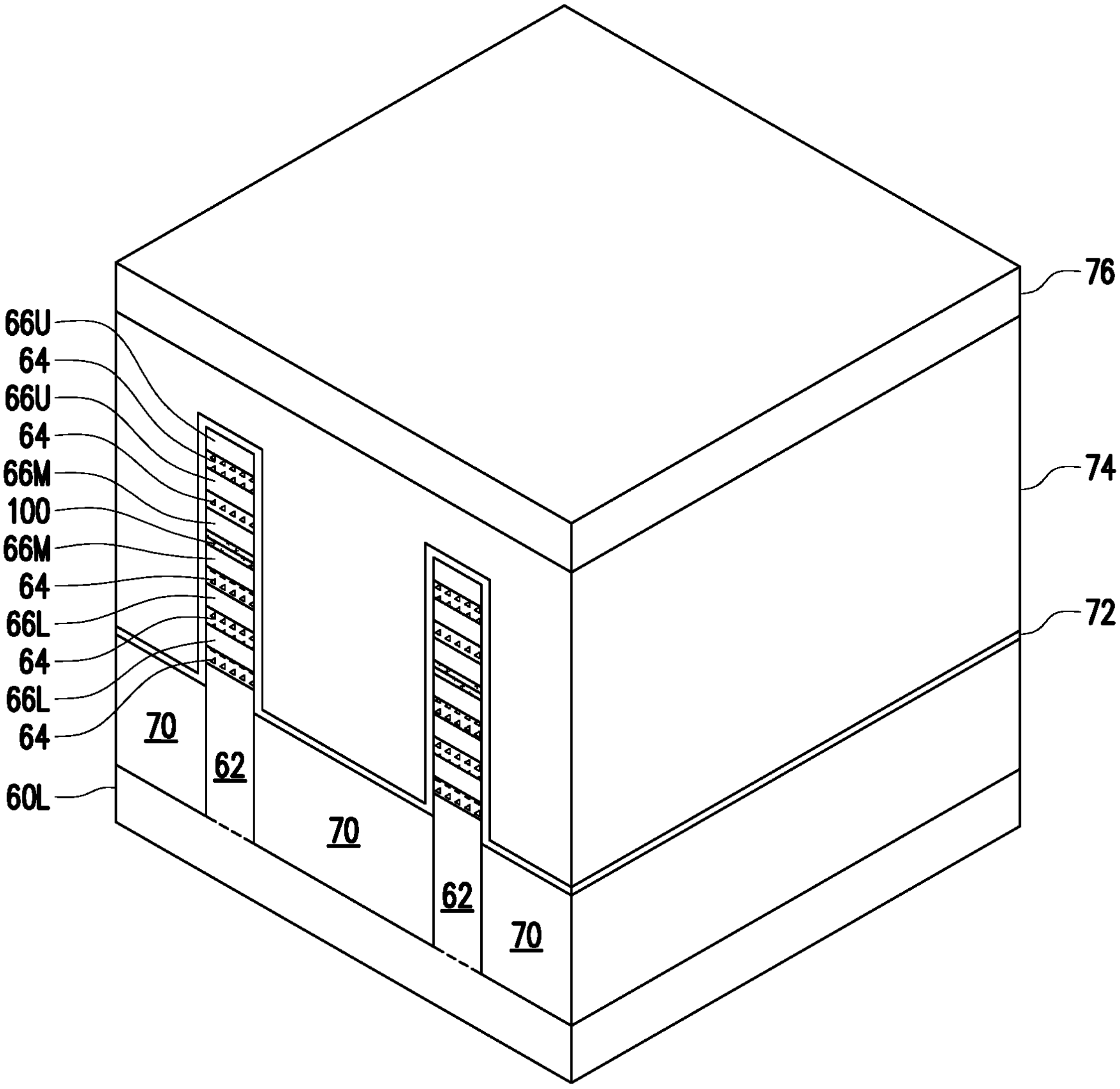

In FIG. 8, a dummy dielectric layer 72 is formed on the semiconductor fins 62, the nanostructures 64, 66, and/or the isolation material 100. The dummy dielectric layer 72 may be, for example, silicon oxide, silicon nitride, a combination thereof, or the like, and may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 74 may be deposited by physical vapor deposition (PVD), CVD, sputter deposition, or other techniques for depositing the selected material. The dummy gate layer 74 may be made of other materials that have a high etching selectivity from the etching of isolation regions. The mask layer 76 may include, for example, silicon nitride, silicon oxynitride, or the like. In the illustrated embodiment, the dummy dielectric layer 72 covers the isolation regions 70, such that the dummy dielectric layer 72 extends between the dummy gate layer 74 and the isolation regions 70. In another embodiment, the dummy dielectric layer 72 covers only the semiconductor fins 62, the nanostructures 64, 66, and/or the isolation material 100.

Figure 9:
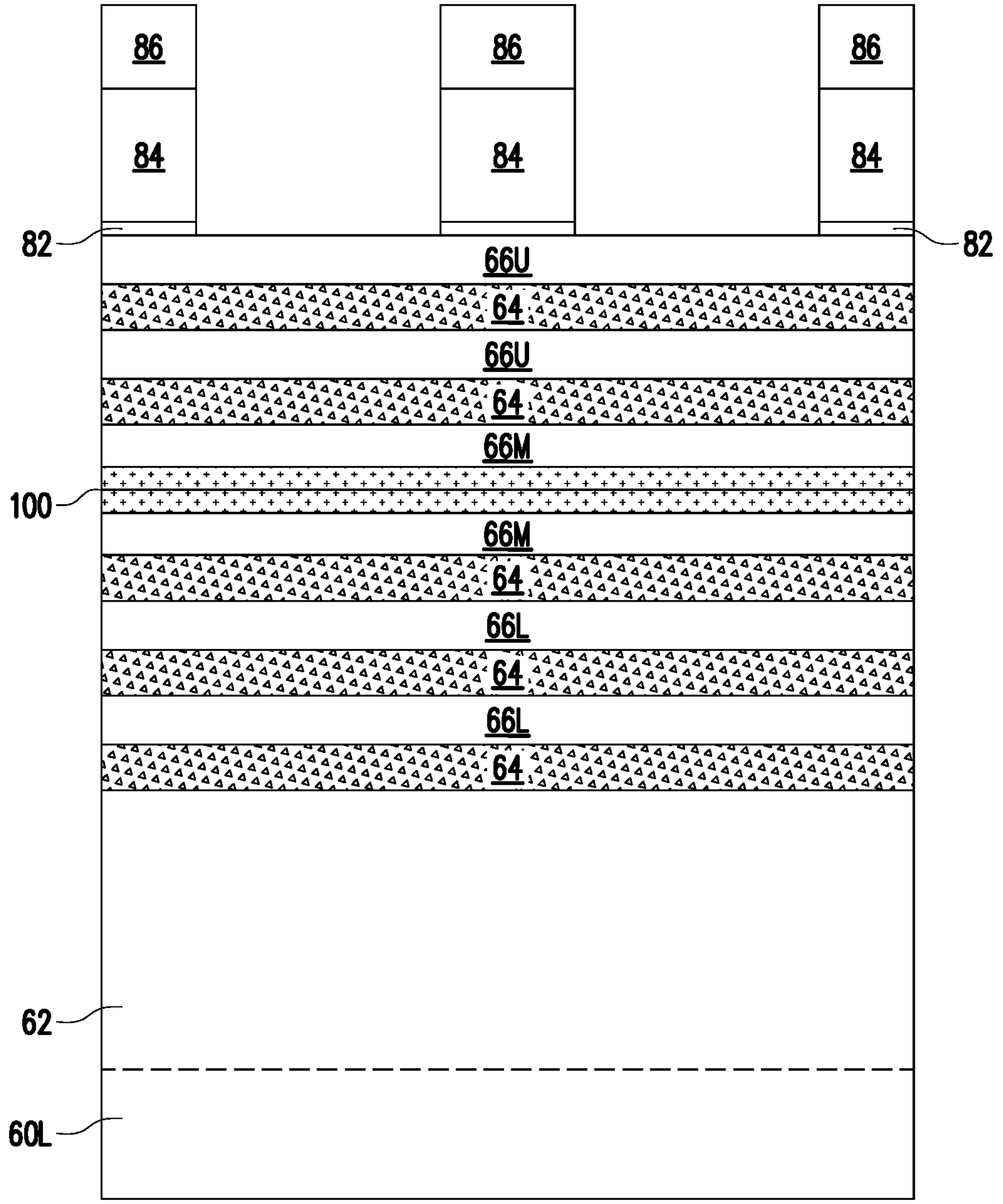

In FIG. 9, the mask layer 76 may be patterned using acceptable photolithography and etching techniques to form masks 86. The pattern of the masks 86 then may be transferred to the dummy gate layer 74 and to the dummy dielectric layer 72 to form dummy gates 84 and dummy dielectrics 82, respectively. The dummy gates 84 cover respective channel regions of the nanostructures 64, 66. The pattern of the masks 86 may be used to physically separate each of the dummy gates 84 from adjacent dummy gates 84. The dummy gates 84 may also have a lengthwise direction substantially perpendicular to the lengthwise direction of respective semiconductor fins 62. The masks 86 can optionally be removed after patterning, such as by any acceptable etching technique.

Figure 10:
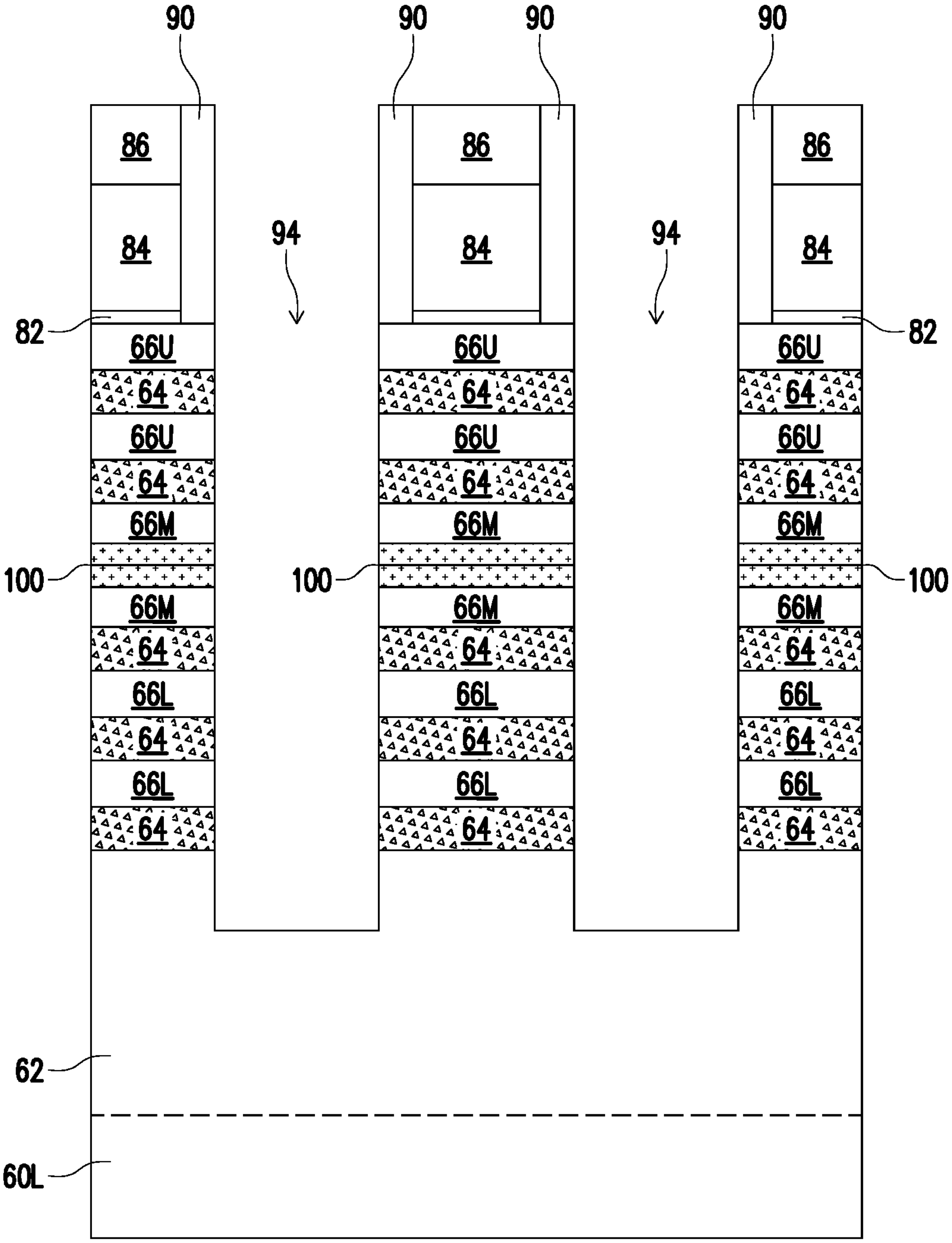

In FIG. 10, gate spacers 90 are formed over the nanostructures 64, 66 and on exposed sidewalls of the masks 86 (if present), the dummy gates 84, and the dummy dielectrics 82. The gate spacers 90 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other dielectric materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). In some embodiments, the dielectric material(s), when etched, may also have portions left on the sidewalls of the semiconductor fins 62 and/or the nanostructures 64, 66. It is noted that the previous disclosure generally describes a process of forming spacers. Other processes and sequences may be used. For example, fewer or additional spacers may be utilized, different sequence of steps may be utilized, additional spacers may be formed and removed, and/or the like.

Source/drain recesses 94 are formed in the semiconductor fins 62, the nanostructures 64, 66, the isolation material 100, and the substrate 60L. Epitaxial source/drain regions will be subsequently formed in the source/drain recesses 94. The source/drain recesses 94 may extend through the nanostructures 64, 66, through the isolation material 100, and into the substrate 60L. The semiconductor fins 62 may be etched such that bottom surfaces of the source/drain recesses 94 are disposed above, below, or level with the top surfaces of the isolation regions 70. The source/drain recesses 94 may be formed by etching the semiconductor fins 62, the nanostructures 64, 66, the isolation material 100, and the substrate 60L using anisotropic etching processes, such as RIE, NBE, or the like. The gate spacers 90 and the dummy gates 84 mask portions of the semiconductor fins 62, the nanostructures 64, 66, the isolation material 100, and the substrate 60L during the etching processes used to form the source/drain recesses 94. A single etch process or multiple etch processes may be used to etch each layer of the nanostructures 64, 66, the isolation material 100, and/or the semiconductor fins 62. Timed etch processes may be used to stop the etching of the source/drain recesses 94 after the source/drain recesses 94 reach a desired depth.

Figure 11:
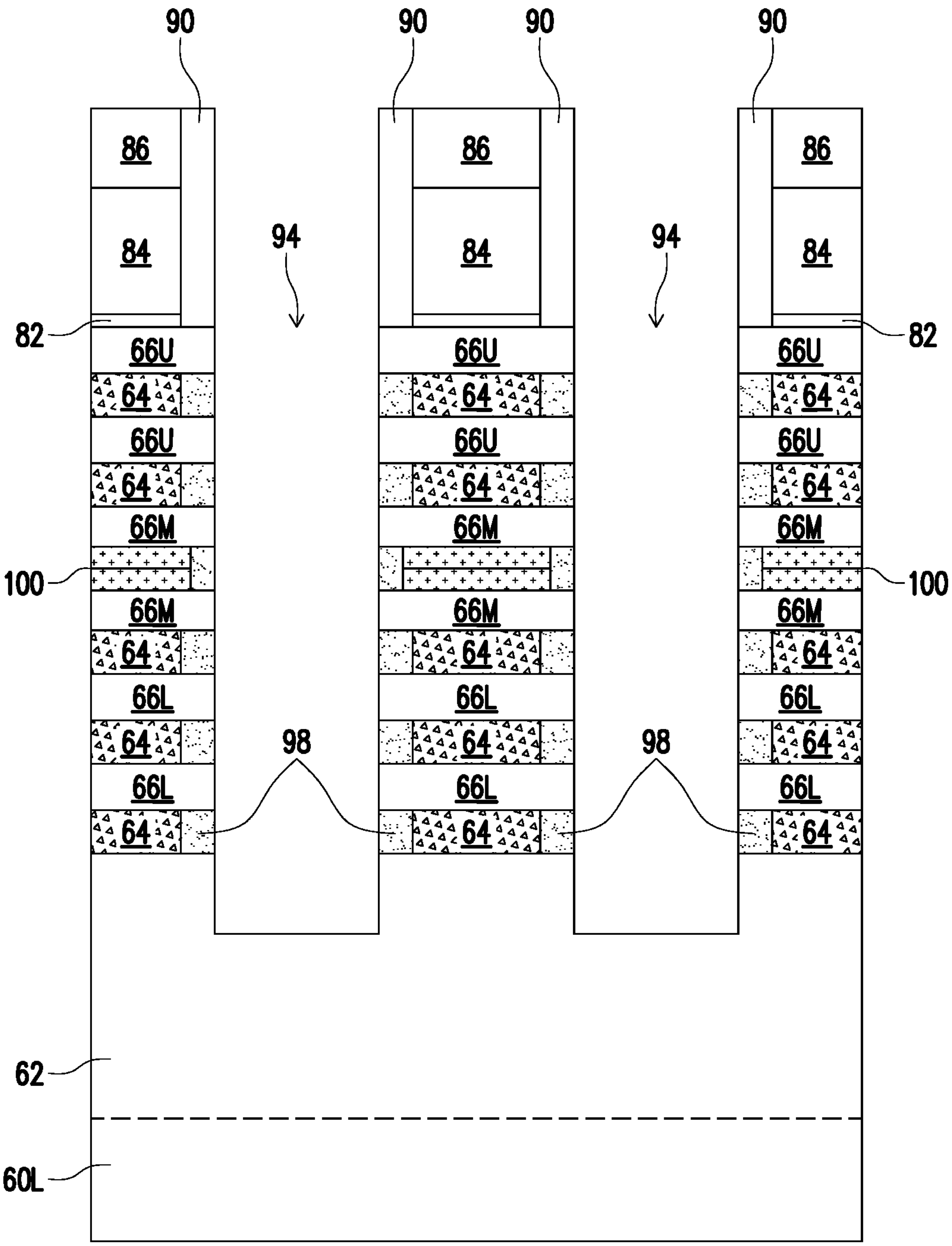

In FIG. 11, inner spacers 98 are formed on sidewalls of the dummy nanostructures 64 and the isolation material 100. To form the inner spacers 98, portions of the sidewalls of the dummy nanostructures 64 and the sidewalls of the isolation material 100 exposed by the source/drain recesses 94 are recessed to form sidewall recesses. The sidewall recesses may be formed by recessing the sidewalls of the dummy nanostructures 64 and isolation material 100 with any acceptable etch process. The etching is selective to the material of the dummy nanostructures 64 (e.g., selectively etches the material of the dummy nanostructures 64 at a faster rate than the material of the semiconductor nanostructures 66). The etching may further be selective to the material of the first isolation material 100 (e.g., selectively etches the material of the first isolation material 100 at a faster rate than the material of the semiconductor nanostructures 66). The etching may be isotropic. Although sidewalls of the dummy nanostructures 64 and the isolation material 100 are illustrated as being straight after the etching, the sidewalls may be concave or convex.

In some embodiments, the same etching process is used to recess the sidewalls of the dummy nanostructures 64 and the isolation material 100. Specifically, the etching process may selectively etches the material of the dummy nanostructures 64 at a faster rate (e.g., as illustrated in FIG. 11), a same rate, or a slower rate than the isolation material 100. The etching rate results in different relative sizes on sidewalls of the dummy nanostructures 64 compared to the isolation material 100. The relative etching rates of the dummy nanostructures 64 and the isolation material 100 may be achieved, for example, by tuning etching parameters of the etching process.

Inner spacers 98 are then formed in the sidewall recesses of the dummy nanostructures 64 and the isolation material 100. As subsequently described in greater detail, source/drain regions will be subsequently formed in the source/drain recesses 94, and the dummy nanostructures 64 will be replaced with corresponding gate structures. The inner spacers 98 act as isolation features between the subsequently formed source/drain regions and the subsequently formed gate structures. Further, the inner spacers 98 may be used to prevent damage to the subsequently formed source/drain regions by subsequent etch processes, such as etch processes used to form gate structures.

The inner spacers 98 may be formed by conformally forming an insulating material in the source/drain recesses 94, and then subsequently etching the insulating material. The insulating material may be a hard dielectric material, such as a carbon-containing dielectric material, such as silicon oxycarbonitride, silicon oxycarbide, silicon oxynitride, or the like. Other low-dielectric constant (low-k) materials having a k-value less than about 3.5 may be utilized. The insulating material may be formed by a deposition process, such as ALD, CVD, or the like. The etching of the insulating material may be anisotropic. For example, the etch process may be a dry etch such as a RIE, a NBE, or the like. The insulating material, when etched, has portions remaining in the sidewall recesses 96A and 96B (thus forming the inner spacers 98).

Although outer sidewalls of the inner spacers 98 are illustrated as being flush with sidewalls of the semiconductor nanostructures 66, the outer sidewalls of the inner spacers 98 may extend beyond or be recessed from sidewalls of the semiconductor nanostructures 66. In other words, the inner spacers 98 may partially fill, completely fill, or overfill the sidewall recesses 96A and 96B. Moreover, although the sidewalls of the inner spacers 98 are illustrated as being straight, those sidewalls may be concave or convex.

Due to differences in size between the sidewall recesses of the dummy nanostructures 64 and the isolation material 100, inner spacers 98 on the isolation material 100 may also have a different size (e.g., width) than the inner spacers 98 on the dummy semiconductor nanostructures 64. For example, in the illustrated embodiment, the inner spacers 98 on the isolation material 100 are less wide than the inner spacers 98 on the dummy semiconductor nanostructures 64. In other embodiments, the inner spacers 98 on the isolation material 100 may be wider or have a same width as the inner spacers 98 on the dummy semiconductor nanostructures 64.

Figure 12A:
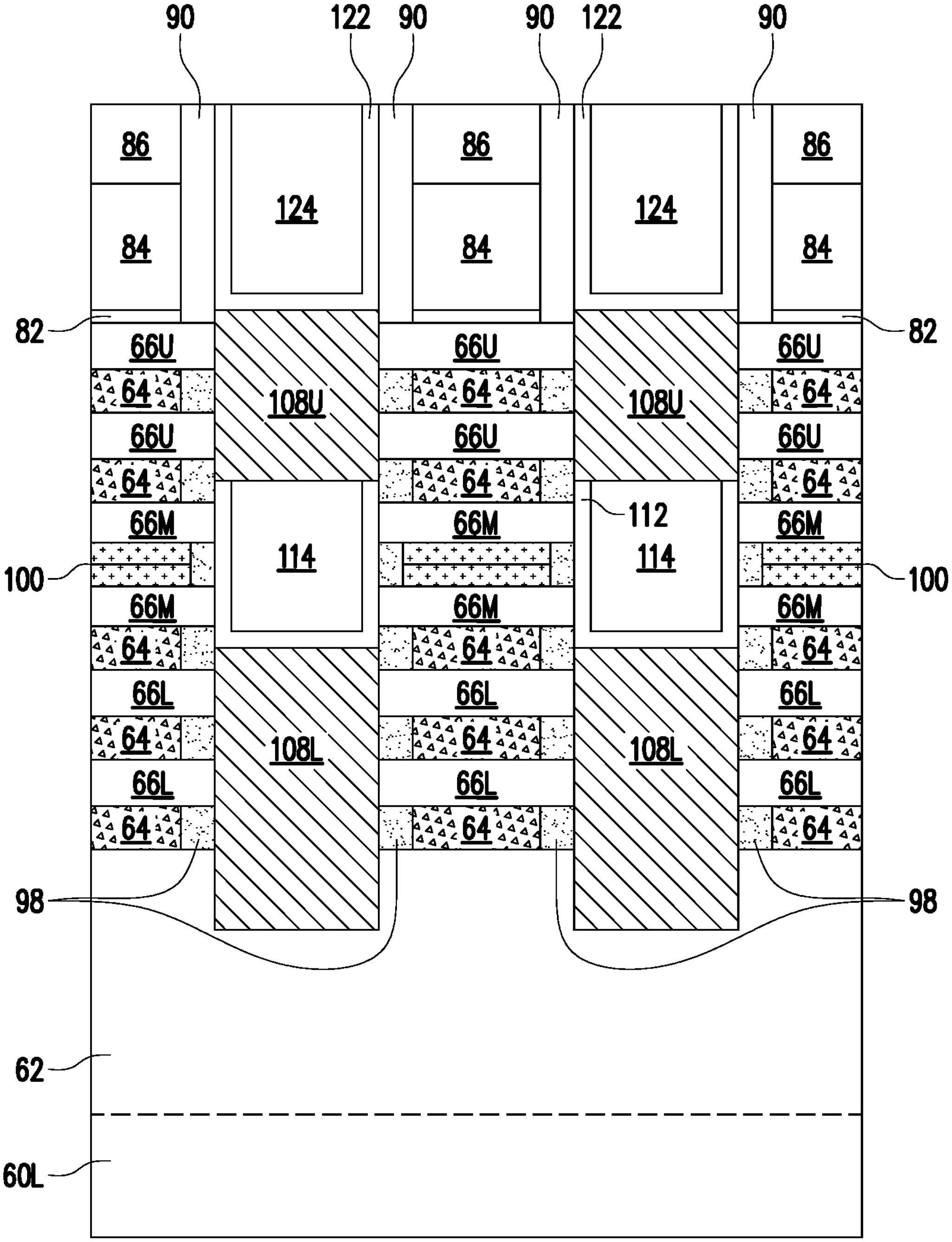
Figure 12B:
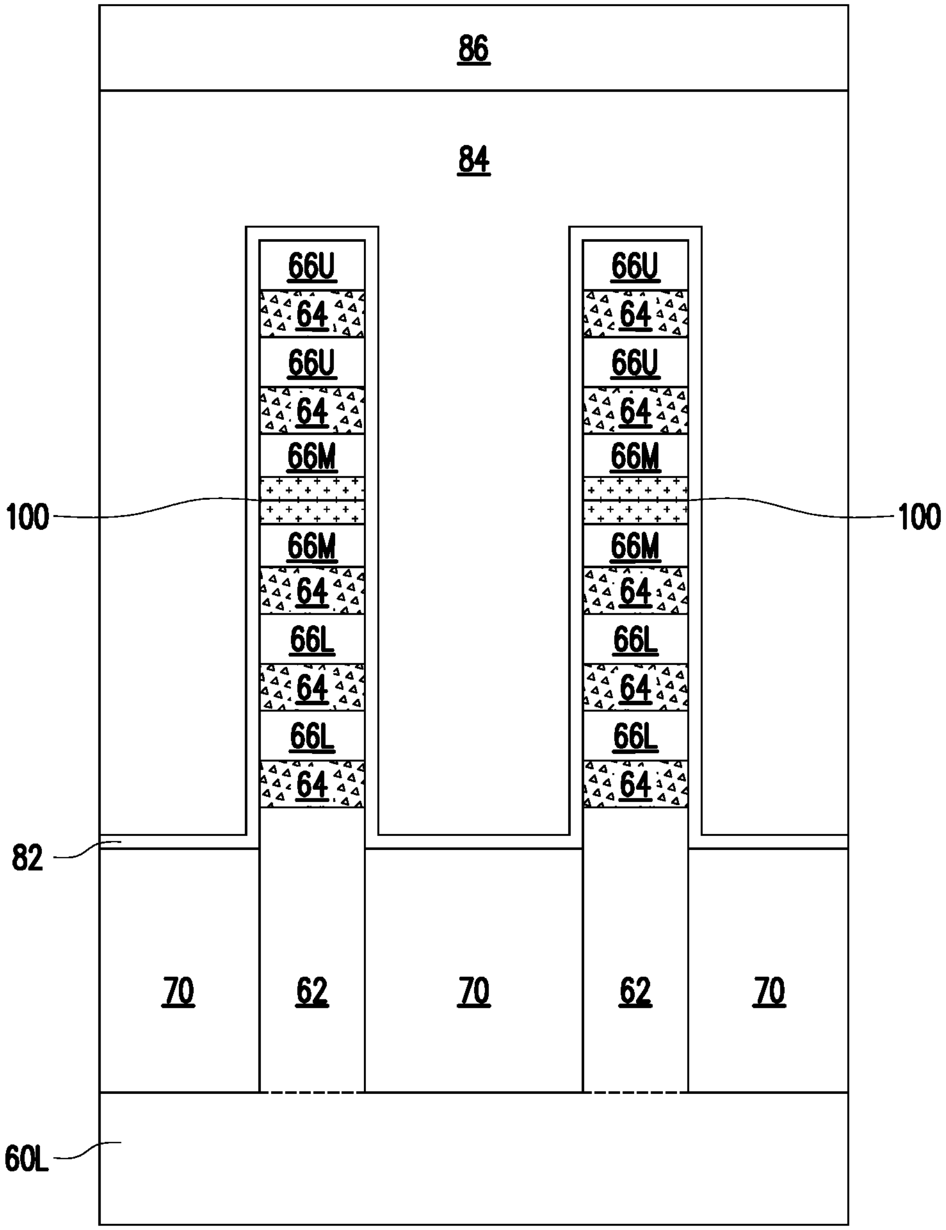
Figure 12C:
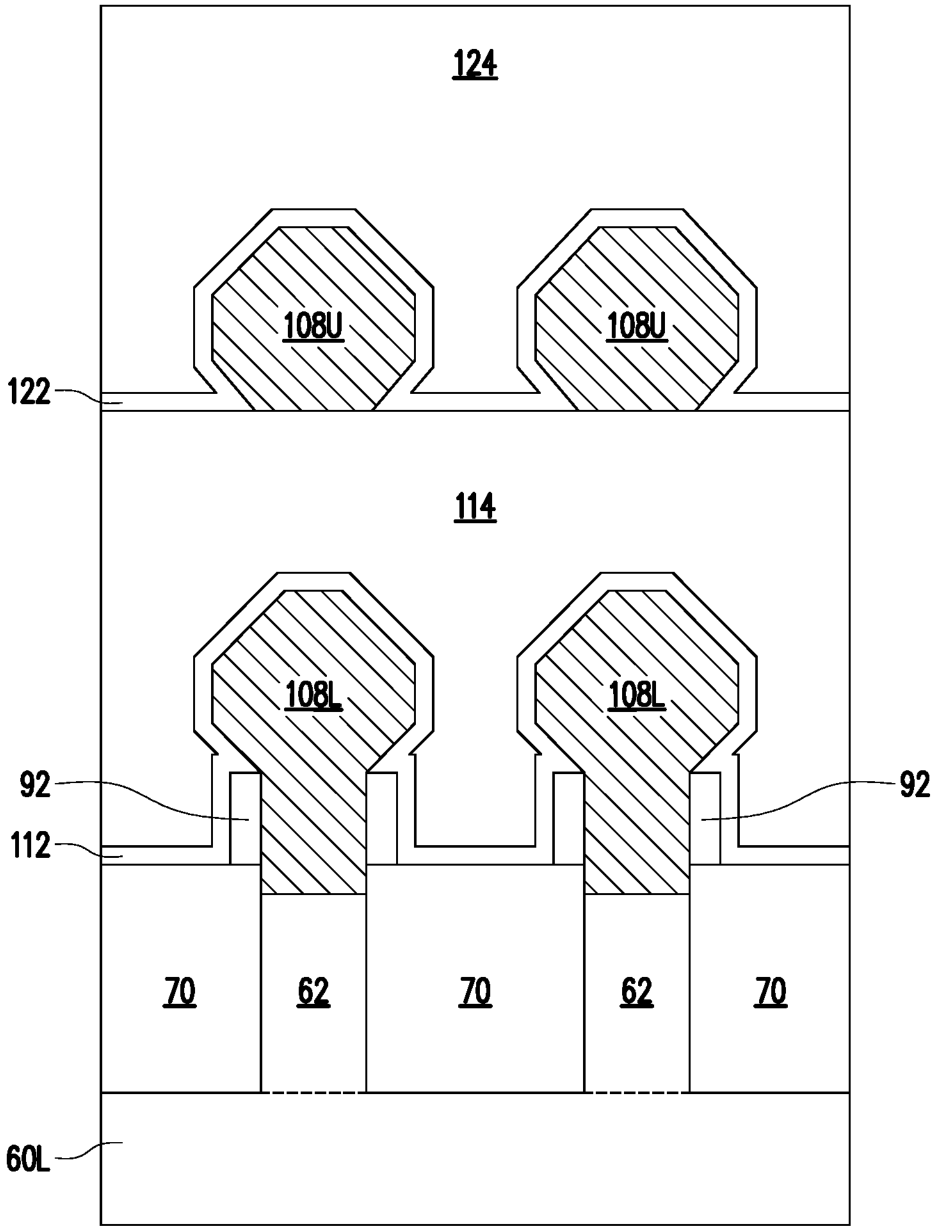

In FIGS. 12A through 12C, lower and upper epitaxial source/drain regions 108L and 108U are formed. The lower epitaxial source/drain regions 108L are formed in the lower portions of the source/drain recesses 94. The lower epitaxial source/drain regions 108L are in contact with the lower semiconductor nanostructures 66L and are not in contact with the upper semiconductor nanostructures 66U. Inner spacers 98 electrically insulate the lower epitaxial source/drain regions 108L from the dummy nanostructures 64, which will be replaced with replacement gates in subsequent processes.

The lower epitaxial source/drain regions 108L are epitaxially grown, and have a conductivity type that is suitable for the device type (p-type or n-type) of the lower nanostructure-FETs. When lower epitaxial source/drain regions 108L are n-type source/drain regions, the respective material may include silicon or carbon-doped silicon, which is doped with an n-type dopant such as phosphorous, arsenic, or the like. When lower epitaxial source/drain regions 108L are p-type source/drain regions, the respective material may include silicon or silicon germanium, which is doped with a p-type dopant such as boron, indium, or the like. The lower epitaxial source/drain regions 108L may be in-situ doped, and may be, or may not be, implanted with the corresponding p-type or n-type dopants. During the epitaxy of the lower epitaxial source/drain regions 108L, the upper semiconductor nanostructures 66U may be masked to prevent undesired epitaxial growth on the upper semiconductor nanostructures 66U. After the lower epitaxial source/drain regions 108L are grown, the masks on the upper semiconductor nanostructures 66U may then be removed.

As a result of the epitaxy processes used for forming the lower epitaxial source/drain regions 108L, upper surfaces of the lower epitaxial source/drain regions 108L have facets which expand laterally outward beyond sidewalls of the multi-layer stacks 22. In some embodiments (see FIG. 12C), adjacent lower epitaxial source/drain regions 108L remain separated after the epitaxy process is completed. In other embodiments, these facets cause neighboring lower epitaxial source/drain regions 108L of a same FET to merge.

A first contact etch stop layer (CESL) 112 and a first ILD 114 are formed over the lower epitaxial source/drain regions 108L. The first CESL 112 may be formed of a dielectric material having a high etching selectivity from the etching of the first ILD 114, such as silicon nitride, silicon oxide, silicon oxynitride, or the like, which may be formed by any suitable deposition process, such as CVD, ALD, or the like. The first ILD 114 may be formed of a dielectric material, which may be deposited by any suitable method, such as CVD, plasma-enhanced CVD (PECVD), or FCVD. The applicable dielectric material of the first ILD 68 may include phospho-silicate glass (PSG), boro-silicate glass (BSG), boron-doped phospho-silicate glass (BPSG), undoped silicate glass (USG), silicon oxide, or the like.

The formation processes may include depositing a conformal CESL layer, depositing a material for the first ILD 114, followed by a planarization process and then an etch-back process. In some embodiments, the first ILD 114 is etched first, leaving the first CESL 112 unetched. An anisotropic etching process is then performed to remove the portions of the first CESL 112 higher than the recessed first ILD 114. After the recessing, the sidewalls of the upper semiconductor nanostructures 66U are exposed.

Upper epitaxial source/drain regions 108U are then formed in the upper portions of the source/drain recesses 94.

The upper epitaxial source/drain regions 108U may be epitaxially grown from exposed surfaces of the upper semiconductor nanostructures 66U. The materials of upper epitaxial source/drain regions 108U may be selected from the same candidate group of materials for forming lower source/drain regions 108L, depending on the desired conductivity type of upper epitaxial source/drain regions 108U. The conductivity type of the upper epitaxial source/drain regions 108U may be opposite the conductivity type of the lower epitaxial source/drain regions 108L. For example, the upper epitaxial source/drain regions 108U may be oppositely doped from the lower epitaxial source/drain regions 108L. The upper epitaxial source/drain regions 108U may be in-situ doped, and/or may be implanted, with an n-type or p-type dopant. Adjacent upper source/drain regions 108U may remain separated (see FIG. 12C) after the epitaxy process or may be merged.

After the epitaxial source/drain regions 108U are formed, a second CESL 122 and a second ILD 124 are formed. The materials and the formation methods may be similar to the materials and the formation methods of first CESL 112 and first ILD 114, respectively, and are not discussed in detail herein. The formation process may include depositing the layers for CESL 122 and ILD 124, and performing a planarization process to remove the excess portion of the corresponding layers. After the planarization process, top surfaces of the second ILD 124, the gate spacers 09, and the dummy gate stacks are coplanar (within process variations). The planarization process may remove masks 86, or leave hard masks 86 unremoved.

Figure 13A:
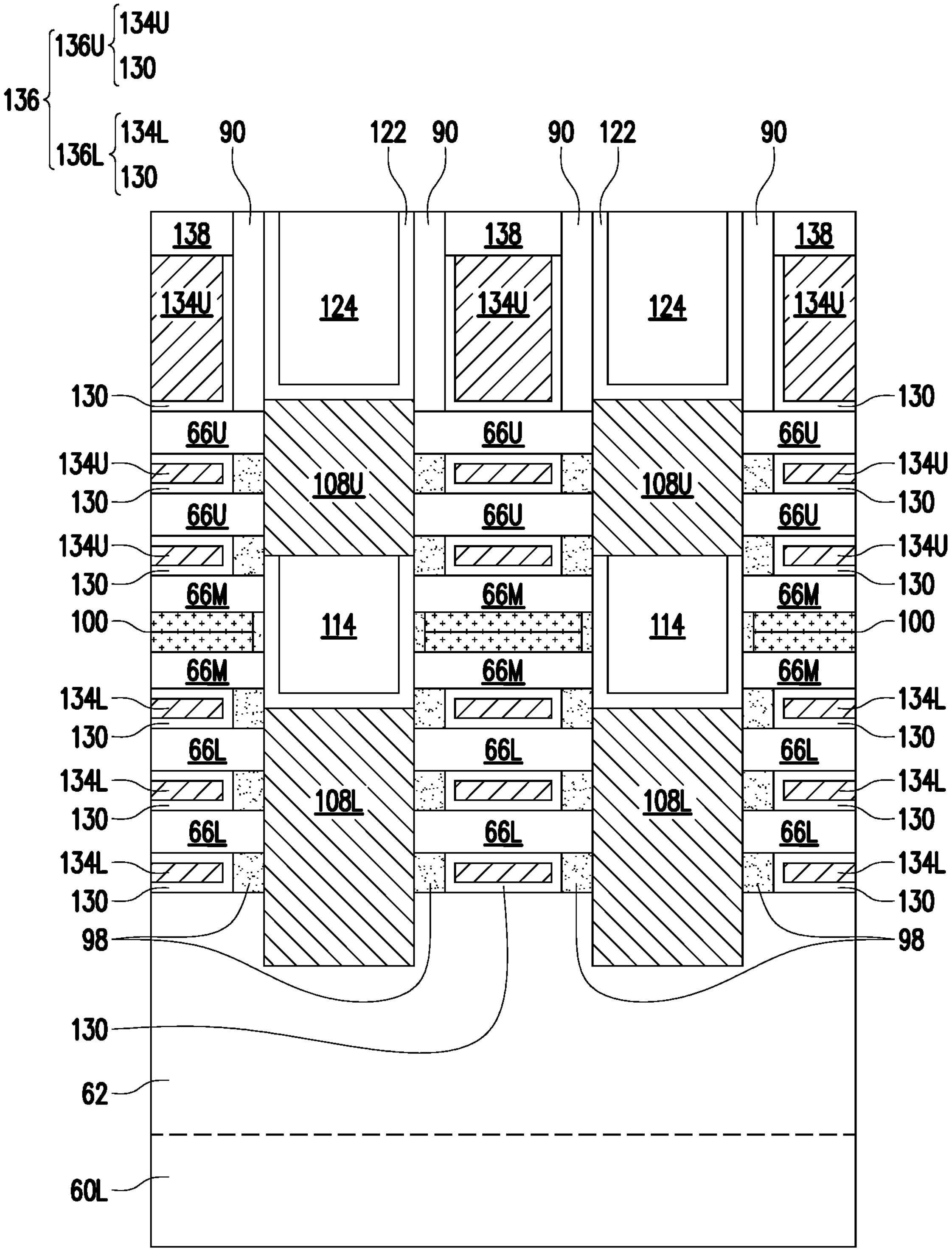
Figure 13B:
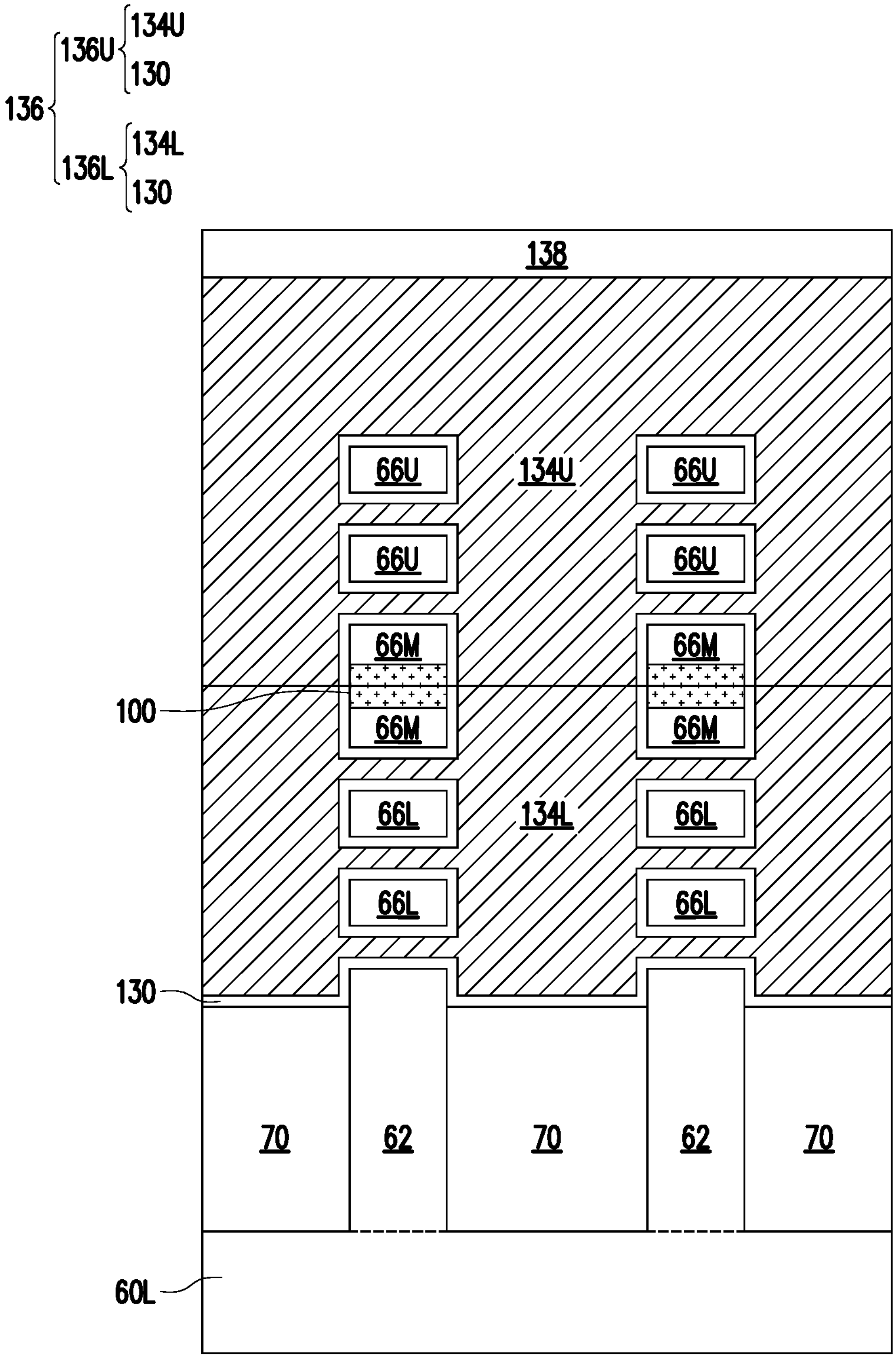
Figure 13C:
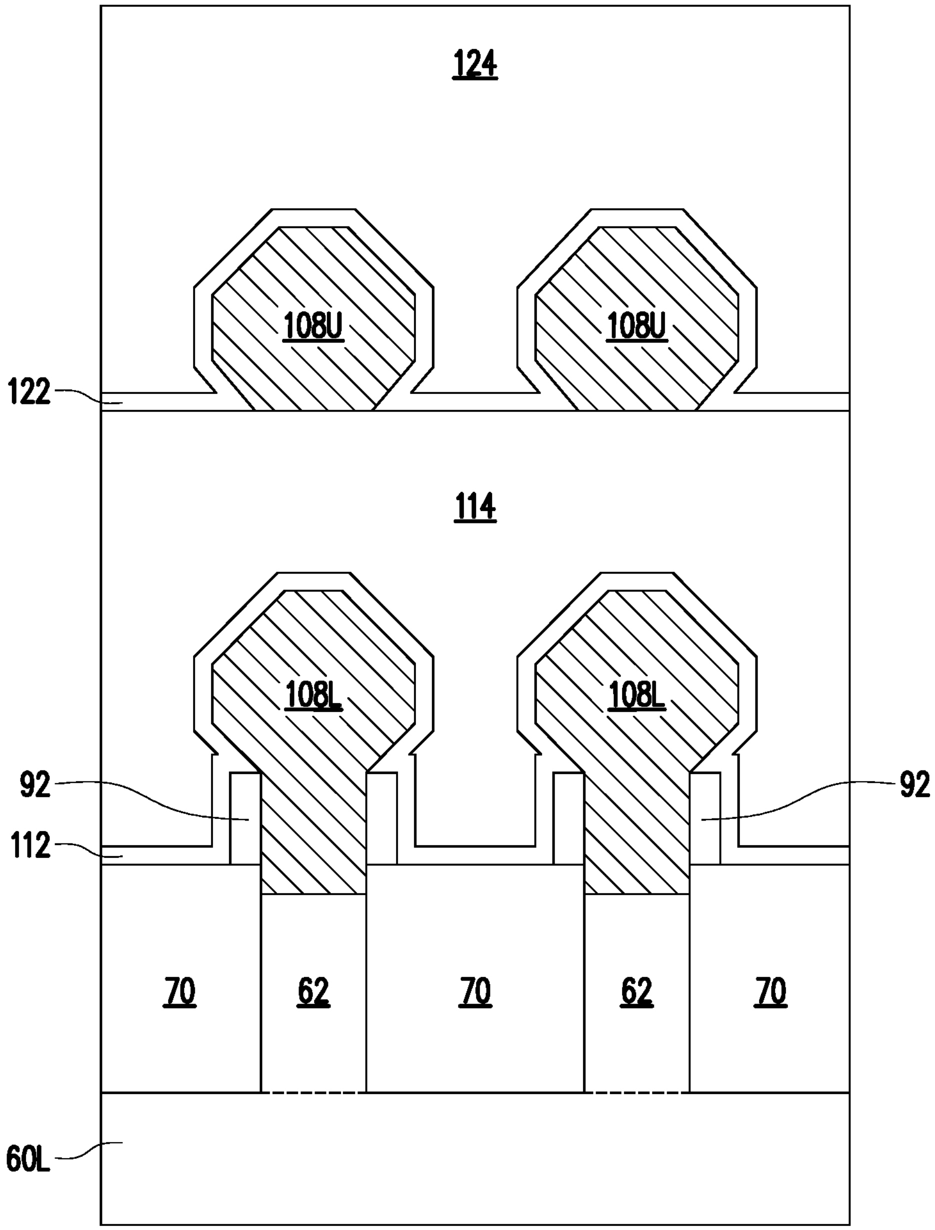

FIGS. 13A through 13C illustrate a replacement gate process to replace the dummy gate stacks 82/84 and the dummy nanostructures 64 with gate stacks 136. The replacement gate process includes first removing the dummy gate stacks 82/84 and the remaining portions of the dummy nanostructures 64. The hard mask 86 (if present) may also be removed. The dummy gate stacks 82/84 are removed in one or more etching processes, so that recesses are defined between the gate spacers 90 and the semiconductor nanostructures 66/dummy nanostructures 64 are exposed. The remaining portions of the dummy nanostructures 64 are then removed through etching, so that the recesses extend between the semiconductor nanostructures 66. In the etching process, the dummy nanostructures 64 is etched at a faster rate than the semiconductor nanostructures 66, the isolation material 100, and the inner spacers 98. The etching may be isotropic. For example, when the dummy nanostructures 64 are formed of silicon-germanium, and the semiconductor nanostructures 66 are formed of silicon, the etch process may include a wet etch process using tetramethylammonium hydroxide (TMAH), ammonium hydroxide ($NH_4OH$), or the like.

Then, gate dielectrics 130 are deposited in the recesses between the gate spacers 90 and on the exposed semiconductor nanostructures 66. The gate dielectrics 130 are conformally formed on the exposed surfaces of the recesses (the removed gate stacks 82/84 and the dummy nanostructures 64) including the semiconductor nanostructures 66, the isolation material 100, and the gate spacers 44. In some embodiments, the gate dielectrics 78 wrap around all (e.g., four) sides of the semiconductor nanostructures 26 and the isolation material 100. Specifically, the gate dielectrics 78 may be formed on the top surfaces of the fins 62; on the top surfaces, the sidewalls, and the bottom surfaces of the semiconductor nanostructures 66U, 66L; on the exposed lateral surfaces and the sidewalls of the semiconductor nanostructures 66M, on the sidewalls of the isolation material 100; and on the sidewalls of the gate spacers 90. The gate dielectrics 130 may include an oxide such as silicon oxide or a metal oxide, a silicate such as a metal silicate, combinations thereof, multi-layers thereof, or the like. The gate dielectrics 130 may include a high-dielectric constant (high-k) material having a k-value greater than about 7.0, such as a metal oxide or a silicate of hafnium, aluminum, zirconium, lanthanum, manganese, barium, titanium, lead, and combinations thereof. The formation methods of the gate dielectrics 130 may include molecular-beam deposition (MBD), ALD, PECVD, and the like. Although single-layered gate dielectrics 130 are illustrated, the gate dielectrics 130 may include multiple layers, such as an interfacial layer and an overlying high-k dielectric layer.

Lower gate electrodes 134L are formed on the gate dielectrics 130 around the lower semiconductor nanostructures 66L. For example, the lower gate electrodes 134L wrap around the lower semiconductor nanostructures 66L. The lower gate electrodes 134L may be formed of a metal-containing material such as tungsten, titanium, titanium nitride, tantalum, tantalum nitride, tantalum carbide, aluminum, ruthenium, cobalt, combinations thereof, multi-layers thereof, or the like. Although single-layered gate electrodes are illustrated, the lower gate electrodes 134L may include any number of work function tuning layers, any number of barrier layers, any number of glue layers, and a fill material.

The lower gate electrodes 134L are formed of material(s) that are suitable for the device type of the lower nanostructure-FETs. For example, the lower gate electrodes 134L may include one or more work function tuning layer(s) formed of material(s) that are suitable for the device type of the lower nanostructure-FETs. In some embodiments, the lower gate electrodes 134L include an n-type work function tuning layer, which may be formed of titanium aluminum, titanium aluminum carbide, tantalum aluminum, tantalum carbide, combinations thereof, or the like. In some embodiments, the lower gate electrodes 134L include a p-type work function tuning layer, which may be formed of titanium nitride, tantalum nitride, combinations thereof, or the like. Additionally or alternatively, the lower gate electrodes 134L may include a dipole-inducing element that is suitable for the device type of the lower nanostructure-FETs. Acceptable dipole-inducing elements include lanthanum, aluminum, scandium, ruthenium, zirconium, erbium, magnesium, strontium, and combinations thereof.

The lower gate electrodes 134L may be formed by conformally depositing one or more gate electrode layer(s) recessing the gate electrode layer(s). Any acceptable etch process, such as a dry etch, a wet etch, the like, or a combination thereof, may be performed to recess the gate electrode layer(s) 134L to a desired level (e.g., at or below a level of the isolation material 100). The etching may be isotropic. Etching the lower gate electrodes 134L may expose the upper semiconductor nanostructures 66U.

In some embodiments, isolation layers (not explicitly illustrated) may be optionally formed on the lower gate electrodes 134L. The isolation layers act as isolation features between the lower gate electrodes 134L and subsequently formed upper gate electrodes 134U. The isolation layers may be formed by conformally depositing a dielectric material (e.g., silicon oxide, silicon nitride, silicon oxynitride, silicon oxycarbonitride, combinations thereof, or the like) and subsequently recessing the dielectric material to expose the upper semiconductor nanostructures 66U.

Then, upper gate electrodes 134U are formed on the isolation layers described above (if present) or the lower gate electrodes 134L. The upper gate electrodes 134U are disposed between the upper semiconductor nanostructures 66U. In some embodiments, the upper gate electrodes 134U wrap around the upper semiconductor nanostructures 66U. The upper gate electrodes 134U may be formed of the same candidate materials and candidate processes for forming the lower gate electrodes 134L. The upper gate electrodes 134U are formed of material(s) that are suitable for the device type of the upper nanostructure-FETs. For example, the upper gate electrodes 134U may include one or more work function tuning layer(s) formed of material(s) that are suitable for the device type of the upper nanostructure-FETs. Although single-layered gate electrodes 134U are illustrated, the upper gate electrodes 134U may include any number of work function tuning layers, any number of barrier layers, any number of glue layers, and a fill material.

Additionally, one or more removal processes are performed level top surfaces of the upper gate electrodes 134U and the gate dielectrics 130 with the second ILD 124. The removal process for forming the gate dielectrics 130 may be the same removal process as the removal process for forming the upper gate electrodes 134U. In some embodiments, a planarization process such as a chemical mechanical polish (CMP), an etch-back process, combinations thereof, or the like may be utilized. After the planarization process, the top surfaces of the upper gate electrodes 134U, the gate dielectrics 130, the second ILD 124, and the gate spacers 90 are substantially coplanar (within process variations). Each respective pair of a gate dielectric 130 and a gate electrode 134 (including an upper gate electrode 134U and/or a lower gate electrode 134L) may be collectively referred to as a "gate stack" 136 (including upper gate stacks 136U and lower gate stacks 136L). Each gate stack 136 extends along three sides (e.g., a top surface, a sidewall, and a bottom surface) of a channel region of a semiconductor nanostructure 66 (see FIG. 1). The lower gate structures 90L may also extend along sidewalls and/or a top surface of a semiconductor fin 62.

As also shown in FIGS. 13A through 13C, gate masks 138 are formed over the gate stacks 136. The formation process may include recessing gate stacks 136, filling the resulting recesses with a dielectric material such as silicon nitride, silicon carbonitride, silicon oxynitride, silicon oxycarbonitride, or the like, and performing a planarization process to remove the excess portions of the dielectric material over the second ILD 124.

Figure 14:
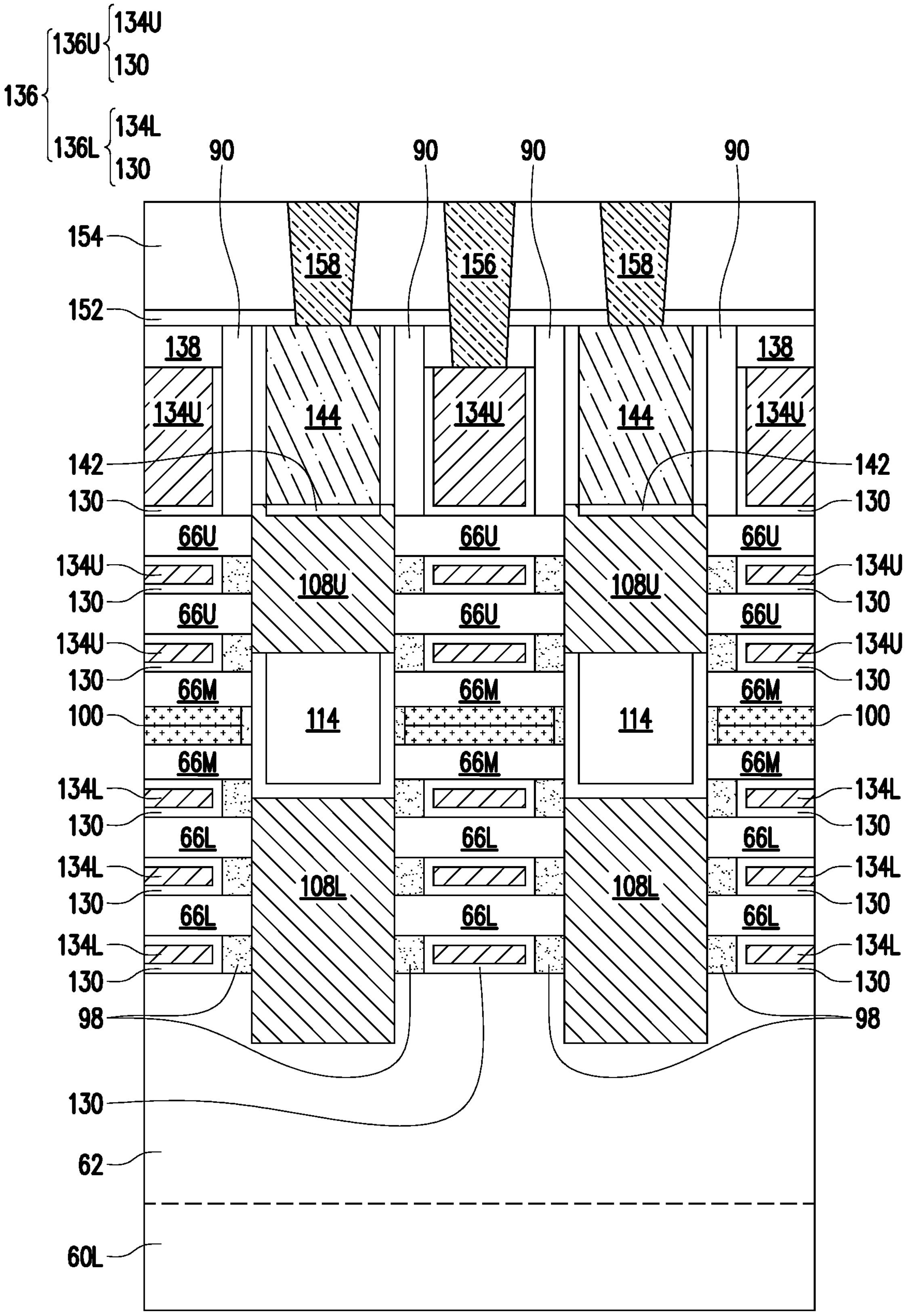

In FIG. 14, silicide regions 142 and source/drain contact plugs 144 are formed through the second ILD 124 to electrically couple to the upper epitaxial source/drain regions 108U and/or the lower epitaxial source/drain regions 108L. As an example to form the source/drain contacts 144, openings are formed through the second ILD 124 and the second CESL 122 using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A removal process may be performed to remove excess material from the top surfaces of the gate spacers 90 and the second ILD 124. The remaining liner and conductive material form the source/drain contacts 144 in the openings. In some embodiments, a planarization process such as a CMP, an etch-back process, combinations thereof, or the like is utilized. After the planarization process, the top surfaces of the gate spacers 90, the second ILD 124, and the source/drain contacts 144 are substantially coplanar (within process variations).

Optionally, metal-semiconductor alloy regions 142 are formed at the interfaces between the source/drain regions 108 and the source/drain contacts 144. The metal-semiconductor alloy regions 142 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 142 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 142. The material(s) of the source/drain contacts 144 can then be formed on the metal-semiconductor alloy regions 142.

An etch stop layer (ESL) 152 and a third ILD 154 are then formed. In some embodiments, The ESL 152 may include a dielectric material having a high etching selectivity from the etching of the third ILD 154, such as, aluminum oxide, aluminum nitride, silicon oxycarbide, or the like. The third ILD 154 may be formed using flowable CVD, ALD, or the like, and the material may include PSG, BSG, BPSG, USG, or the like, which may be deposited by any suitable method, such as CVD, PECVD, or the like.

Subsequently, gate contact plugs 156 and source/drain vias 158 are formed to contact the upper gate electrodes 136U and the source/drain contact plugs 144, respectively. As an example to form the gate contacts 156 and the source/drain vias 158, openings for the gate contacts 156 and the source/drain vias 158 are formed through the third ILD 154, the ESL 152, and the gate masks 138. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the third ILD 154. The remaining liner and conductive material form the gate contacts 156 and the source/drain vias 158 in the openings. The gate contacts 156 and the source/drain vias 158 may be formed in distinct processes, or may be formed in the same process. Although shown as being formed in the same cross-section, it should be appreciated that each of the gate contacts 156 and the source/drain vias 158 may be formed in different cross-sections, which may avoid shorting of the contacts.

The active devices as illustrated are collectively referred to as a device layer 170. In some embodiments, contacts to the lower gate stacks 136L and the lower source/drain regions 108L may be made through a backside of the device layer 170 (e.g., a side opposite to source/drain contact plugs 144).

According to various embodiments, a CFET includes a n-type nanostructure-FET and a p-type nanostructure-FET that are vertically stacked together. NFET channel regions of the n-type nanostructure-FET and pFET channel regions of the p-type nanostructure-FET may be epitaxially grown on two different substrates each oriented in a different crystalline plane. For example, the NFET channel regions may be formed of first semiconductor layers that are epitaxially grown on a (100) plane-oriented silicon substrate, and the PFET channel regions may be formed of second semiconductor layers that are epitaxially grown on a (110) plane-oriented silicon substrate. Subsequently, the two substrates are bonded together, and CFETs are formed from the bonded structure. In this manner, p-type nanostructure FETs can be formed on (110) plane-oriented silicon for increased mobility without degrading the performance of the n-type nanostructure FETs. As such, various embodiments allow for a CFET with improved p-type nanostructure FET performance without compromising the n-type nanostructure FET performance.

In some embodiments, a method includes epitaxially growing a first multi-layer stack over a first substrate; epitaxially growing a second multi-layer stack over a second substrate, wherein the first substrate and the second substrate have different crystalline orientations; bonding the first multi-layer stack to the second multi-layer stack; patterning the first multi-layer stack and the second multi-layer stack to form a fin, the fin comprising a plurality of lower nanostructures alternatingly stacked with first dummy nanostructures and a plurality of upper nanostructures over the plurality of lower nanostructures, the plurality of upper nanostructures being alternatingly stacked with second dummy nanostructures; replacing the first dummy nanostructures with a first gate stack, the first gate stack surrounding each of the plurality of lower nanostructures; and replacing the second dummy nanostructures with a second gate stack, the second gate stack surrounding each of the plurality of upper nanostructures. In some embodiments, bonding the first multi-layer stack to the second multi-layer stack comprises: depositing a first bonding layer over the first multi-layer stack; depositing a second bonding layer over the second multi-layer stack; and directly bonding the first bonding layer the second bonding layer by dielectric-to-dielectric bonding. In some embodiments, forming the fin further comprises patterning the first bonding layer and the second bonding layer. In some embodiments, the method further includes patterning source/drain recesses in the fin; forming first source/drain regions in the source/drain recesses, the plurality of lower nanostructures extending between the first source/drain regions; depositing an insulating layer in the source/drain recesses over the first source/drain regions; and forming second source/drain regions in the source/drain recesses over the insulating layer, the plurality of upper nanostructures extending between the second source/drain regions. In some embodiments, the first substrate is a (110) crystalline-plane oriented substrate, and wherein the second substrate is a (100) crystalline-plane oriented substrate. In some embodiments, replacing the first dummy nanostructures with the first gate stack defines channel regions for a p-type transistor from the plurality of lower nanostructures. In some embodiments, replacing the second dummy nanostructures with the second gate stack defines channel regions for an n-type transistor from the plurality of upper nanostructures. In some embodiments, the first substrate is a (100) crystalline-plane oriented substrate, and wherein the second substrate is a (110) crystalline-plane oriented substrate. In some embodiments, the method further includes depositing an isolation layer over the first gate stack, wherein the second gate stack is deposited over the isolation layer, and wherein the isolation layer extends between the plurality of lower nanostructures and the plurality of upper nanostructures.

In some embodiments, a method includes epitaxially growing a first semiconductor layer and a second semiconductor layer over a first semiconductor substrate; epitaxially growing a third semiconductor layer and a fourth semiconductor layer over a second semiconductor substrate, the first semiconductor substrate having a different crystalline orientation than the second semiconductor substrate; depositing a first bonding layer over the second semiconductor layer; depositing a second bonding layer over the fourth semiconductor layer; directly bonding the first bonding layer to the second bonding layer to form a bonded layer; patterning the second semiconductor substrate, the third semiconductor layer, the fourth semiconductor layer, the bonded layer, the second semiconductor layer, and the first semiconductor layer to define a fin extending upwards from the first semiconductor substrate; patterning source/drain recesses in the fin; forming first source/drains in the source/drain recesses; depositing a first isolation layer over the first source/drain; and forming second source/drains in the source/drain recesses over the first isolation layer. In some embodiments, defining the fin comprises: defining a lower nanostructure from the first semiconductor layer, wherein forming the first source/drains comprises forming the first source/drains adjacent to the lower nanostructures; defining an upper nanostructure from the third semiconductor layer, wherein forming the second source/drains comprises forming second first source/drains adjacent to the upper nanostructures; defining a first dummy nanostructure from the second semiconductor layer; defining a second dummy nanostructure from the fourth semiconductor layer; and defining an isolation material from the bonded layer. In some embodiments, the method further includes replacing the first dummy nanostructure with a lower gate stack, the lower gate stack being disposed around the lower nanostructure; and replacing the second dummy nanostructure with an upper gate stack, the upper gate stack being disposed around the upper nanostructure. In some embodiments, the method further includes replacing the isolation material with a second isolation layer, the second isolation layer being disposed between the lower nanostructure and the upper nanostructure, wherein the second isolation layer is deposited over the lower gate stack, and wherein the upper gate stack is deposited over the second isolation layer. In some embodiments, directly bonding the first bonding layer to the second bonding layer comprises a dielectric-to-dielectric bonding process comprising: terminating a first surface of the first bonding layer or a second surface of the second bonding layer with hydroxyl groups; contacting the first surface of the first bonding layer to the second surface of the second bonding layer; and after contacting the first surface of the first bonding layer to the second surface of the second bonding layer, annealing the first bonding layer and the second bonding layer to form covalent bonds at an interface between the first bonding layer and the second bonding layer. In some embodiments, the method further includes thinning the second semiconductor substrate prior to patterning the second semiconductor substrate. In some embodiments, the first semiconductor substrate is a (110) plane-oriented crystalline substrate, and wherein the second semiconductor substrate is a (100) plane-oriented crystalline substrate. In some embodiments, epitaxially growing the first semiconductor layer and the second semiconductor layer over the second semiconductor substrate comprises epitaxially growing the first semiconductor layer and the second semiconductor layer in accordance with a crystalline orientation of the second semiconductor substrate, and wherein epitaxially growing the third semiconductor layer and the fourth semiconductor layer over the second semiconductor substrate comprises epitaxially growing the third semiconductor layer and the fourth semiconductor layer in accordance with a crystalline orientation of the second semiconductor substrate.

In some embodiments, a device includes upper nanostructures over lower nanostructures, the upper nanostructures having a different crystalline orientation than the lower nanostructures; an isolation material between the upper nanostructures and the lower nanostructures; a lower gate structure around the lower nanostructures; an upper gate structure around the upper nanostructures; lower source/drain regions, the lower nanostructures extending between the lower source/drain regions; an first insulating layer over the lower source/drain regions; and upper source/drain regions over the first insulating layer, the upper nanostructures extending between the upper source/drain regions. In some embodiments, the lower nanostructures, the lower source/drain regions, and the lower gate structure provide a p-type transistor, wherein the upper nanostructures, the upper source/drain regions, and the upper gate structure provide an n-type transistor, wherein the lower nanostructures have an (110) plane crystalline orientation, and wherein the upper nanostructures have a (100) plane crystalline orientation. In some embodiments, the lower source/drain regions, and the lower gate structure provide an n-type transistor, wherein the upper nanostructures, the upper source/drain regions, and the upper gate structure provide a p-type transistor, wherein the lower nanostructures have an (100) plane crystalline orientation, and wherein the upper nanostructures have a (110) plane crystalline orientation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

epitaxially growing a first multi-layer stack over a first substrate;

epitaxially growing a second multi-layer stack over a second substrate, wherein the first substrate and the second substrate have different crystalline orientations;

bonding the first multi-layer stack to the second multi-layer stack;

patterning the first multi-layer stack and the second multi-layer stack to form a fin, the fin comprising a plurality of lower nanostructures alternatingly stacked with first dummy nanostructures and a plurality of upper nanostructures over the plurality of lower nanostructures, the plurality of upper nanostructures being alternatingly stacked with second dummy nanostructures;

replacing the first dummy nanostructures with a first gate stack, the first gate stack surrounding each of the plurality of lower nanostructures; and replacing the second dummy nanostructures with a second gate stack, the second gate stack surrounding each of the plurality of upper nanostructures.

2. The method of claim 1, wherein bonding the first multi-layer stack to the second multi-layer stack comprises:

depositing a first bonding layer over the first multi-layer stack;

depositing a second bonding layer over the second multi-layer stack; and directly bonding the first bonding layer to the second bonding layer by dielectric-to-dielectric bonding.

3. The method of claim 2, wherein forming the fin further comprises patterning the first bonding layer and the second bonding layer.

4. The method of claim 1 further comprising:

patterning source/drain recesses in the fin;

forming first source/drain regions in the source/drain recesses, the plurality of lower nanostructures extending between the first source/drain regions;

depositing an insulating layer in the source/drain recesses over the first source/drain regions; and forming second source/drain regions in the source/drain recesses over the insulating layer, the plurality of upper nanostructures extending between the second source/drain regions.

5. The method of claim 1, wherein the first substrate is a (110) crystalline-plane oriented substrate, and wherein the second substrate is a (100) crystalline-plane oriented substrate.

6. The method of claim 5, wherein replacing the first dummy nanostructures with the first gate stack defines channel regions for a p-type transistor from the plurality of lower nanostructures.

7. The method of claim 6, wherein replacing the second dummy nanostructures with the second gate stack defines channel regions for an n-type transistor from the plurality of upper nanostructures.

8. The method of claim 1, wherein the first substrate is a (100) crystalline-plane oriented substrate, and wherein the second substrate is a (110) crystalline-plane oriented substrate.

9. The method of claim 1 further comprising depositing an isolation layer over the first gate stack, wherein the second gate stack is deposited over the isolation layer, and wherein the isolation layer extends between the plurality of lower nanostructures and the plurality of upper nanostructures.

10. A method comprising:

epitaxially growing a first semiconductor layer and a second semiconductor layer over a first semiconductor substrate;

epitaxially growing a third semiconductor layer and a fourth semiconductor layer over a second semiconductor substrate, the first semiconductor substrate having a different crystalline orientation than the second semiconductor substrate;

depositing a first bonding layer over the second semiconductor layer;

depositing a second bonding layer over the fourth semiconductor layer;

directly bonding the first bonding layer to the second bonding layer to form a bonded layer;

patterning the second semiconductor substrate, the third semiconductor layer, the fourth semiconductor layer, the bonded layer, the second semiconductor layer, and the first semiconductor layer to define a fin extending upwards from the first semiconductor substrate;

patterning source/drain recesses in the fin;

forming first source/drains in the source/drain recesses;

depositing a first isolation layer over the first source/drains; and forming second source/drains in the source/drain recesses over the first isolation layer.

11. The method of claim 10, wherein defining the fin comprises:

defining a lower nanostructure from the first semiconductor layer, wherein forming the first source/drains comprises forming the first source/drains adjacent to the lower nanostructures;

defining an upper nanostructure from the third semiconductor layer, wherein forming the second source/drains comprises forming second source/drains adjacent to the upper nanostructures;

defining a first dummy nanostructure from the second semiconductor layer;

defining a second dummy nanostructure from the fourth semiconductor layer; and defining an isolation material from the bonded layer.

12. The method of claim 11, further comprising:

replacing the first dummy nanostructure with a lower gate stack, the lower gate stack being disposed around the lower nanostructure; and replacing the second dummy nanostructure with an upper gate stack, the upper gate stack being disposed around the upper nanostructure.

13. The method of claim 12, further comprising:

replacing the isolation material with a second isolation layer, the second isolation layer being disposed between the lower nanostructure and the upper nanostructure, wherein the second isolation layer is deposited over the lower gate stack, and wherein the upper gate stack is deposited over the second isolation layer.

14. The method of claim 10, wherein directly bonding the first bonding layer to the second bonding layer comprises a dielectric-to-dielectric bonding process comprising:

terminating a first surface of the first bonding layer or a second surface of the second bonding layer with hydroxyl groups;

contacting the first surface of the first bonding layer to the second surface of the second bonding layer; and after contacting the first surface of the first bonding layer to the second surface of the second bonding layer, annealing the first bonding layer and the second bonding layer to form covalent bonds at an interface between the first bonding layer and the second bonding layer.

15. The method of claim 10 further comprising thinning the second semiconductor substrate prior to patterning the second semiconductor substrate.

16. The method of claim 10, wherein the first semiconductor substrate is a (110) plane-oriented crystalline substrate, and wherein the second semiconductor substrate is a (100) plane-oriented crystalline substrate.

17. The method of claim 10, wherein epitaxially growing the first semiconductor layer and the second semiconductor layer over the second semiconductor substrate comprises epitaxially growing the first semiconductor layer and the second semiconductor layer in accordance with a crystalline orientation of the second semiconductor substrate, and wherein epitaxially growing the third semiconductor layer and the fourth semiconductor layer over the second semiconductor substrate comprises epitaxially growing the third semiconductor layer and the fourth semiconductor layer in accordance with a crystalline orientation of the second semiconductor substrate.

18. A device comprising:

upper nanostructures over lower nanostructures, the upper nanostructures having a different crystalline orientation than the lower nanostructures;

an isolation structure between the upper nanostructures and the lower nanostructures, wherein the isolation structure comprises a first dielectric material bonded to a second dielectric material;

a lower gate structure around the lower nanostructures;

an upper gate structure around the upper nanostructures;

lower source/drain regions, the lower nanostructures extending between the lower source/drain regions;

a first insulating layer over the lower source/drain regions; and upper source/drain regions over the first insulating layer, the upper nanostructures extending between the upper source/drain regions.

19. The device of claim 18, wherein the lower nanostructures, the lower source/drain regions, and the lower gate structure provide a p-type transistor, wherein the upper nanostructures, the upper source/drain regions, and the upper gate structure provide an n-type transistor, wherein the lower nanostructures have an (110) plane crystalline orientation, and wherein the upper nanostructures have a (100) plane crystalline orientation.

20. The device of claim 18, wherein the lower nanostructures, the lower source/drain regions, and the lower gate structure provide an n-type transistor, wherein the upper nanostructures, the upper source/drain regions, and the upper gate structure provide a p-type transistor, wherein the lower nanostructures have an (100) plane crystalline orientation, and wherein the upper nanostructures have a (110) plane crystalline orientation.

* * * * *